US009490371B2

(12) United States Patent
Noh et al.

(10) Patent No.: US 9,490,371 B2
(45) Date of Patent: Nov. 8, 2016

(54) NONVOLATILE MEMORY DEVICES AND METHODS OF FABRICATING THE SAME

(71) Applicants: Young-Jin Noh, Suwon-si (KR); Bio Kim, Seoul (KR); Kwangmin Park, Seoul (KR); Jaeyoung Ahn, Seongnam-si (KR); SeungHyun Lim, Seoul (KR); JaeHo Choi, Busan (KR); Jumi Yun, Pocheon-si (KR); Ji-Hoon Choi, Seongnam-si (KR)

(72) Inventors: Young-Jin Noh, Suwon-si (KR); Bio Kim, Seoul (KR); Kwangmin Park, Seoul (KR); Jaeyoung Ahn, Seongnam-si (KR); SeungHyun Lim, Seoul (KR); JaeHo Choi, Busan (KR); Jumi Yun, Pocheon-si (KR); Ji-Hoon Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 14/539,043

(22) Filed: Nov. 12, 2014

(65) Prior Publication Data
US 2015/0194440 A1    Jul. 9, 2015

(30) Foreign Application Priority Data

Jan. 9, 2014    (KR) ........................ 10-2014-0002929

(51) Int. Cl.
*H01L 29/792*    (2006.01)
*H01L 29/66*    (2006.01)
*H01L 27/115*    (2006.01)

(52) U.S. Cl.
CPC ....... *H01L 29/7926* (2013.01); *H01L 27/1157* (2013.01); *H01L 27/11582* (2013.01); *H01L 29/66833* (2013.01); *H01L 29/792* (2013.01)

(58) Field of Classification Search
None
See application file for complete search history.

(56) References Cited

U.S. PATENT DOCUMENTS

| 7,851,850 | B2 | 12/2010 | Bhattacharyya |
| 8,609,524 | B2 | 12/2013 | Frohberg et al. |
| 2006/0255399 | A1 | 11/2006 | Kim et al. |
| 2006/0281260 | A1* | 12/2006 | Lue ..................... G11C 16/0475 438/264 |
| 2008/0093661 | A1* | 4/2008 | Joo .................... H01L 21/28282 257/324 |
| 2008/0272424 | A1 | 11/2008 | Kim et al. |
| 2009/0114977 | A1 | 5/2009 | Park et al. |
| 2010/0052037 | A1 | 3/2010 | Chin |
| 2010/0157680 | A1* | 6/2010 | Higuchi ............ H01L 21/28282 365/185.18 |
| 2012/0286349 | A1* | 11/2012 | Tan .................... H01L 21/28273 257/324 |
| 2013/0140621 | A1 | 6/2013 | Chin et al. |
| 2014/0061770 | A1* | 3/2014 | Lee .................... H01L 29/66825 257/324 |

FOREIGN PATENT DOCUMENTS

| KR | 20080010514 A | 1/2008 |
| KR | 20090020982 A | 2/2009 |
| KR | 20090068012 A | 6/2009 |
| KR | 20090123326 A | 12/2009 |
| KR | 20100010739 A | 2/2010 |
| KR | 20130007816 A | 1/2013 |

* cited by examiner

*Primary Examiner* — Ali Naraghi
(74) *Attorney, Agent, or Firm* — Myers Bigel & Sibley, P.A.

(57) ABSTRACT

A nonvolatile memory device includes a gate structure including inter-gate insulating patterns that are vertically stacked on a substrate and gate electrodes interposed between the inter-gate insulating patterns, a vertical active pillar connected to the substrate through the gate structure, a charge-storing layer between the vertical active pillar and the gate electrode, a tunnel insulating layer between the charge-storing layer and the vertical active pillar, and a blocking insulating layer between the charge-storing layer and the gate electrode. The charge-storing layer include first and second charge-storing layers that are adjacent to the blocking insulating layer and the tunnel insulating layer, respectively. The first charge-storing layer includes a silicon nitride layer, and the second charge-storing layer includes a silicon oxynitride layer.

20 Claims, 31 Drawing Sheets

NONVOLATILE MEMORY DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2014-0002929, filed on Jan. 9, 2014, in the Korean Intellectual Property Office, the disclosure of which is hereby incorporated by reference.

BACKGROUND

Example embodiments of the inventive concept relate to semiconductor devices and methods of fabricating the same, and in particular, to nonvolatile memory devices and methods of fabricating the same.

Increasing the integration density of semiconductor devices is desired to satisfy demands for superior performance and inexpensive prices. In particular, the level of integration of semiconductor devices may affect product prices. The integration density of typical two-dimensional or planar memory devices may be determined by the area occupied by a unit memory cell. Thus, integration of the two-dimensional or planar memory devices may be influenced by the technology used for forming patterns with very small feature sizes in semiconductor layers and other materials used in the fabrication of the devices. However, process equipment for decreasing the feature size of patterns may be very expensive, and therefore can set a practical limitation on increasing the integration density of two-dimensional or planar memory devices.

SUMMARY

Some embodiments of the inventive concepts provide a nonvolatile memory device with improved reliability.

Other some embodiments of the inventive concepts provide a method of fabricating a nonvolatile memory device with improved reliability.

According to some embodiments of the inventive concepts, a nonvolatile memory device may include a gate structure including inter-gate insulating patterns vertically stacked on a substrate and gate electrodes interposed between the inter-gate insulating patterns, a vertical active pillar connected to the substrate through the gate structure, a charge-storing layer between the vertical active pillar and the gate electrode, a tunnel insulating layer between the charge-storing layer and the vertical active pillar, and a blocking insulating layer between the charge-storing layer and the gate electrode. The charge-storing layer may include first and second charge-storing layers that are adjacent to the blocking insulating layer and the tunnel insulating layer, respectively, the first charge-storing layer may be a silicon nitride layer, and the second charge-storing layer may be a silicon oxynitride layer and may have a thickness of 5-20 Å.

In some embodiments, the tunnel insulating layer may include a first tunnel insulating layer adjacent to the second charge-storing layer and a second tunnel insulating layer adjacent to the vertical active pillar, and the first tunnel insulating layer may be a silicon oxide layer having a nitrogen concentration lower than that of the second charge-storing layer.

In some embodiments, the second tunnel insulating layer may be a silicon oxide layer, whose nitrogen concentration is between nitrogen concentrations of the first tunnel insulating layer and the second charge-storing layer.

In some embodiments, the tunnel insulating layer may be formed to contain 5-20 at. % nitrogen, and the second charge-storing layer may be formed to contain at least 30 at. % nitrogen.

In some embodiments, the blocking insulating layer may include a first blocking insulating layer adjacent to the charge-storing layer and a second blocking insulating layer adjacent to the gate electrode.

In some embodiments, the first blocking insulating layer may be a silicon oxide layer, and the second blocking insulating layer may be an aluminum oxide layer.

In some embodiments, at least a portion of the blocking insulating layer extends between the gate electrode and the inter-gate insulating patterns.

In some embodiments, at least a portion of the blocking insulating layer extends between the vertical active pillar and the inter-gate insulating patterns.

In some embodiments, at least a portion of the charge-storing layer extends between the gate electrode and the inter-gate insulating patterns.

In some embodiments, at least a portion of the charge-storing layer extends between the vertical active pillar and the inter-gate insulating patterns.

According to some embodiments of the inventive concepts, a method of fabricating a nonvolatile memory device may include alternately forming insulating layers and sacrificial layer on a substrate, forming a vertical hole penetrating the insulating layers and the sacrificial layer and exposing the substrate, forming a tunnel insulating layer on a side surface of the vertical hole, forming a vertical active pillar on the tunnel insulating layer, selectively removing the sacrificial layer to form recessed region between the insulating layers, forming a gate electrode in the recessed region, forming a charge-storing layer between the tunnel insulating layer and the gate electrode, and forming a blocking insulating layer between the charge-storing layer and the gate electrode. The charge-storing layer may include first and second charge-storing layers that are adjacent to the blocking insulating layer and the tunnel insulating layer, respectively, and the first charge-storing layer may be a silicon nitride layer. The second charge-storing layer may be a silicon oxynitride layer and may have a thickness of 5-20 Å.

In some embodiments, the silicon nitride layer and the silicon oxynitride layer may be formed by an ALD method, in which $Si_2Cl_6$ is used as a silicon source.

In some embodiments, the forming of the tunnel insulating layer may include forming first and second silicon oxide layers that are adjacent to the second charge-storing layer and the vertical active pillar, respectively, and the first silicon oxide layer may be formed in such a way that nitrogen concentration thereof is lower than that of the second charge-storing layer.

In some embodiments, the tunnel insulating layer may be formed to contain 5-20 at. % nitrogen, and the second charge-storing layer may be formed to contain at least 30 at. % nitrogen.

In some embodiments, the tunnel insulating layer may be formed in such a way that the second silicon oxide layer is a nitrogen concentration between those of the first silicon oxide layer and the second charge-storing layer.

BRIEF DESCRIPTION OF THE DRAWINGS

The inventive concepts will be more clearly understood from the following brief description taken in conjunction with the accompanying drawings. The accompanying drawings represent non-limiting, example embodiments as described herein.

FIGS. 9A through 14A are sectional views taken along a line I-I' of FIG. 8B to illustrate a method of fabricating the nonvolatile memory device according to some embodiments of the inventive concept, and FIGS. 9B through 14B are enlarged views of portions "A" of FIGS. 9A through 14A, respectively.

Figure 1:
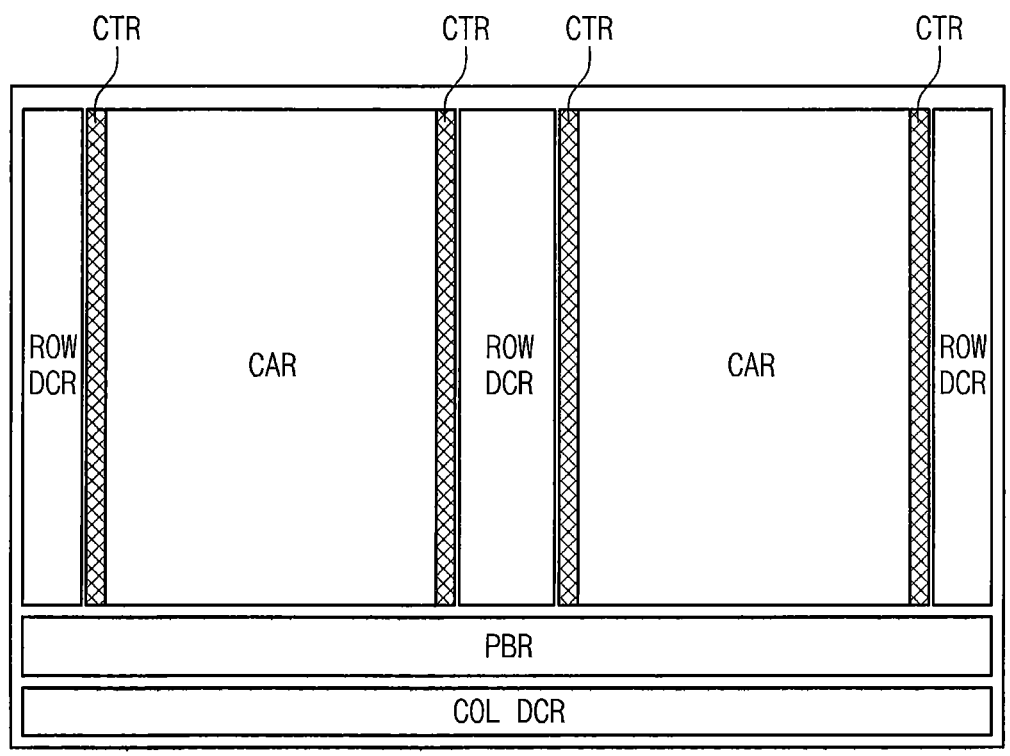
FIG. 1 is a schematic diagram illustrating a layout of a nonvolatile memory device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EMBODIMENTS

Embodiments of the inventive concepts will now be described more fully with reference to the accompanying drawings, in which example embodiments are shown. Embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the this specification and relevant art and will not be interpreted in an idealized or overly formal sense unless expressly so defined herein.

A nonvolatile memory device according to some embodiments of the inventive concept may be, for example, an NAND FLASH memory device, but the inventive concepts may not be limited thereto.

Figure 2:
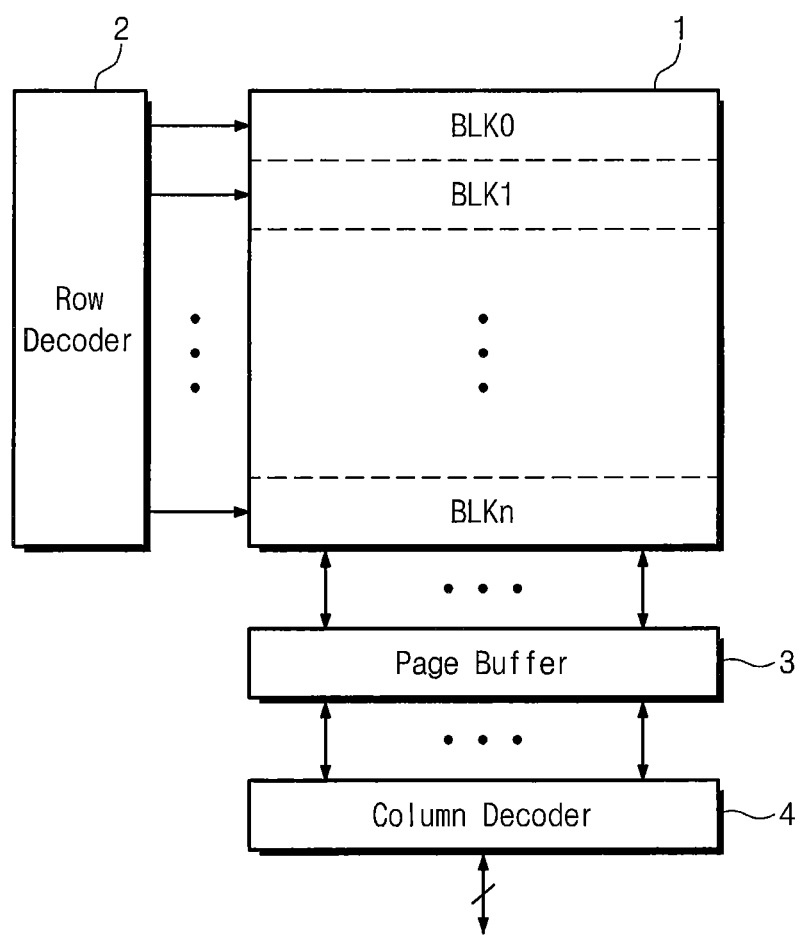
FIG. 2 is a block diagram illustrating a nonvolatile memory device according to embodiments of the inventive concept.

FIG. 1 is a schematic diagram illustrating a layout of a nonvolatile memory device according to some embodiments of the inventive concepts. FIG. 2 is a block diagram illustrating a nonvolatile memory device according to embodiments of the inventive concepts.

Referring to FIG. 1, a nonvolatile memory device may include a cell array region CAR and a peripheral circuit region. The peripheral circuit region may include at least one row decoder region ROW DCR, at least one page buffer region PBR, and at least one column decoder region COL DCR. Furthermore, a contact region CTR may be provided between the cell array region CAR and each row decoder region ROW DCR.

Referring to FIGS. 1 and 2, a memory cell array 1 including a plurality of memory cells may be provided on the cell array region CAR. The memory cell array 1 may further include word and bit lines electrically connected to the memory cells, in addition to the memory cells. In some embodiments, the memory cell array 1 may include a plurality of memory blocks BLK0-BLKn, each of which is configured to independently perform an erase operation. The memory cell array 1 will be described in more detail with reference to FIG. 3.

In each row decoder region ROW DCR, a row decoder 2 may be provided to allow for selection of the word lines in the memory cell array 1. In each contact region CTR, an interconnection structure may be provided to connect the memory cell array 1 to the row decoder 2. The row decoder 2 may be configured to select a specific one out of the memory blocks BLK0-BLKn of the memory cell array 1 and moreover a specific one out of the word lines of the selected memory block, depending on address information. In addition, the row decoder 2 may be configured to provide word-line voltages, which are generated in a voltage generator (not shown), adaptively to the selected word line and un-selected word lines, in response to control signals from a control circuit (not shown).

In each page buffer region PBR, at least one page buffer 3 may be provided to read out data stored in the memory cells. Depending on an operation mode, each page buffer 3 may execute a process of temporarily storing data to be stored in the memory cells or of reading out data stored in the memory cells. For example, the page buffer 3 may function as a write driver in a program operation mode or as a sense amplifier in a read operation mode.

A column decoder 4 connected to the bit lines of the memory cell array 1 may be provided in each column decoder region COL DCR. The column decoder 4 may be configured to provide data-transmission paths between the page buffer 3 and an external device (e.g., a memory controller).

Figure 3:
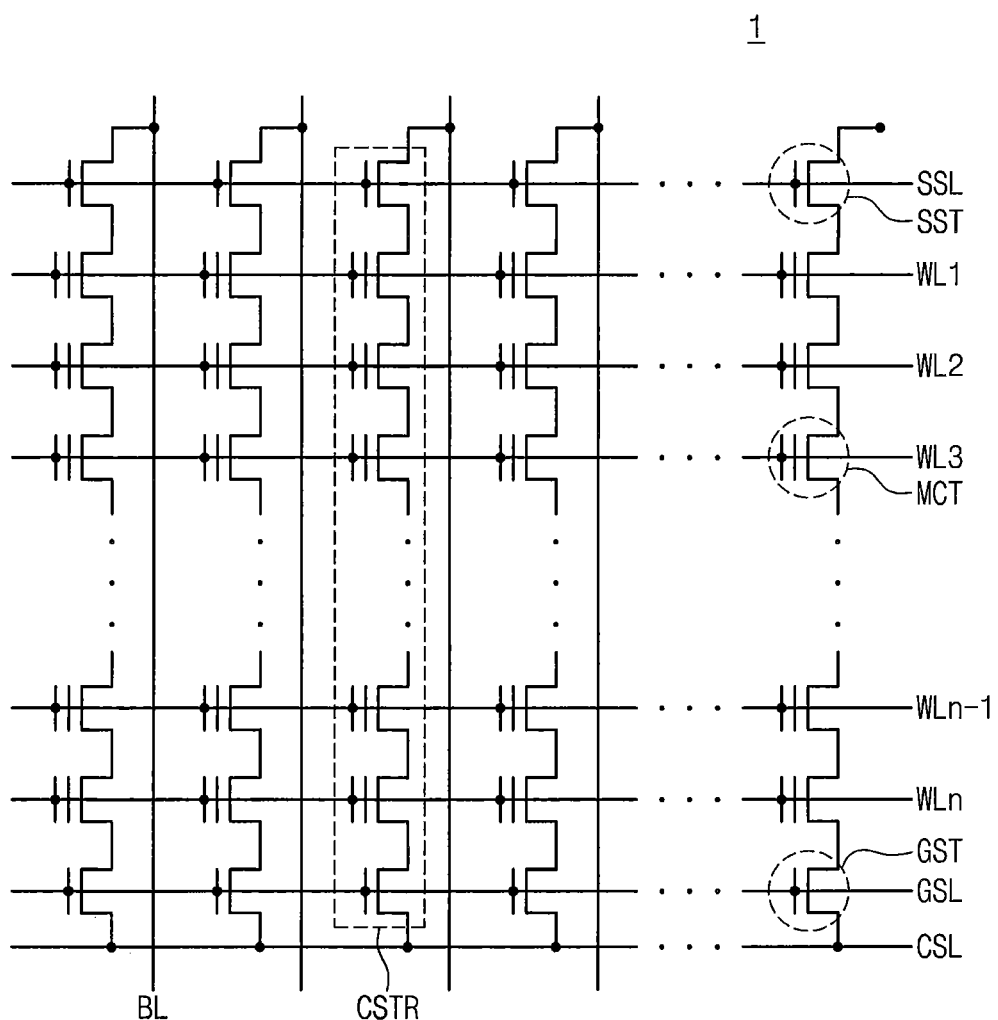
FIG. 3 is a schematic circuit diagram illustrating a memory cell array of a nonvolatile memory device according to some embodiments of the inventive concept.

FIG. 3 is a schematic circuit diagram illustrating a memory cell array of a nonvolatile memory device according to example embodiments of the inventive concept.

Referring to FIG. 3, a nonvolatile memory device may include a memory cell array, in which a common source line CSL, a plurality of bit lines BL, and a plurality of cell strings CSTR are provided.

The bit lines BL may be arranged two-dimensionally, and a plurality of cell strings CSTR may be connected in parallel to each of the bit lines BL. The cell strings CSTR may be connected in common to the common source line CSL. In other words, the plurality of cell strings CSTR may be provided between the plurality of bit lines BL and the common source line CSL.

Each of the cell strings CSTR may include a ground selection transistor GST connected to the common source line CSL, a string selection transistor SST connected to one of the bit lines BL, and a plurality of memory cell transistors MCT provided between the ground and string selection transistors GST and SST. In addition, the memory cell transistors MCT may be connected in series to the ground selection transistor GST and the string selection transistor SST.

Figure 4:
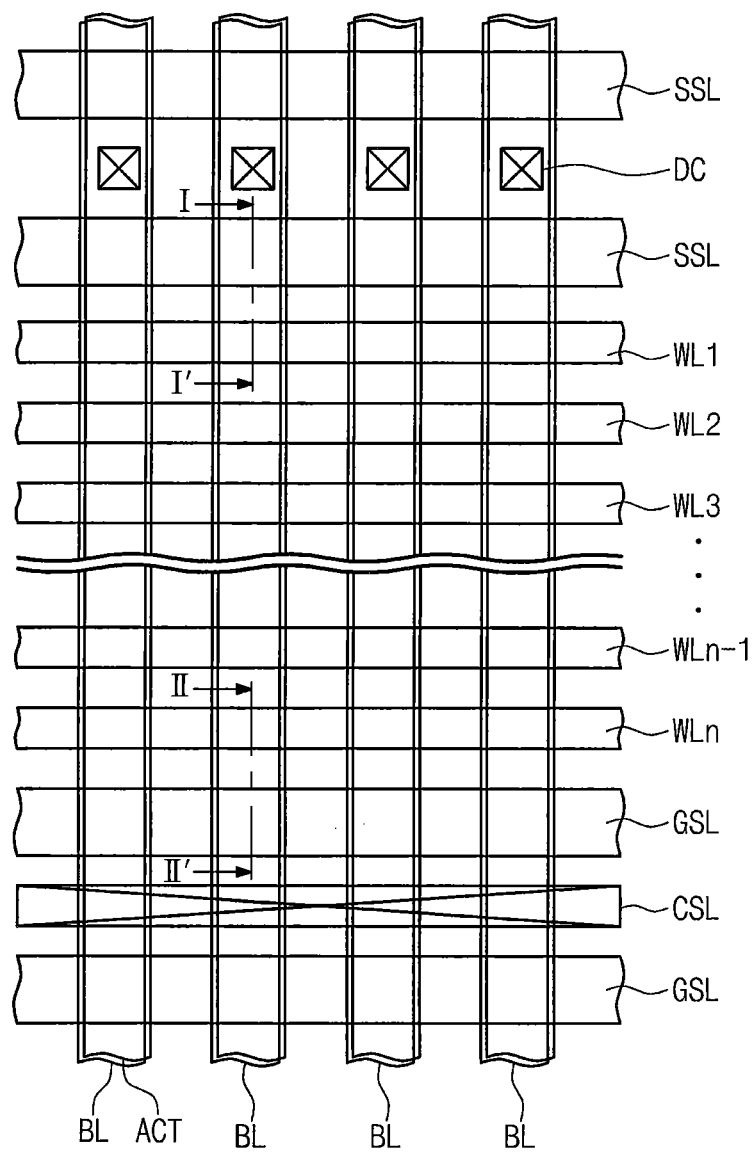
FIG. 4 is a plan view illustrating a memory cell array of a nonvolatile memory device according to some embodiments of the inventive concept.

FIG. 4 is a plan view illustrating a memory cell array of a nonvolatile memory device according to some embodiments of the inventive concept.

Referring to FIG. 4, a string selection line SSL and a ground selection line GSL may be disposed to be parallel to each other and cross active regions ACT. A plurality of word lines WL1-WLn may be arranged between the string selection line SSL and the ground selection line GSL. A contact plug DC may be provided between an adjacent pair of the string selection lines SSL and may be electrically connected to a corresponding one of the bit lines BL. The common source line CSL may be provided between an adjacent pair of the ground selection lines GSL.

Figure 5A:
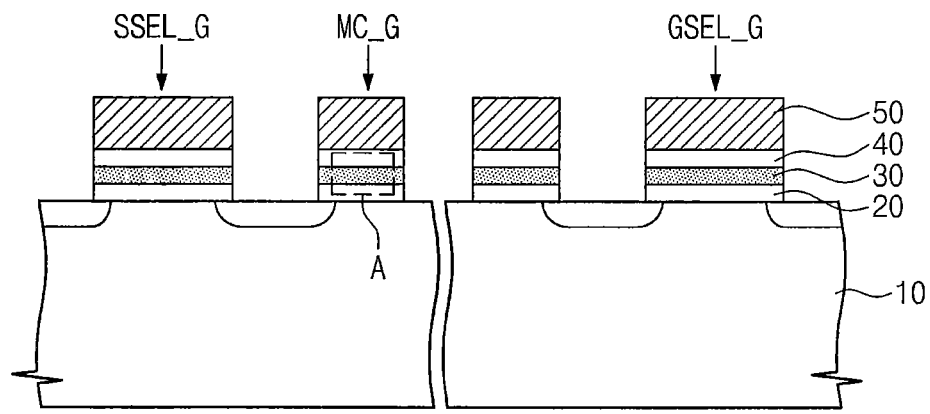
FIG. 5A is a sectional view taken along a line I-I' of FIG. 4.
Figure 5B:
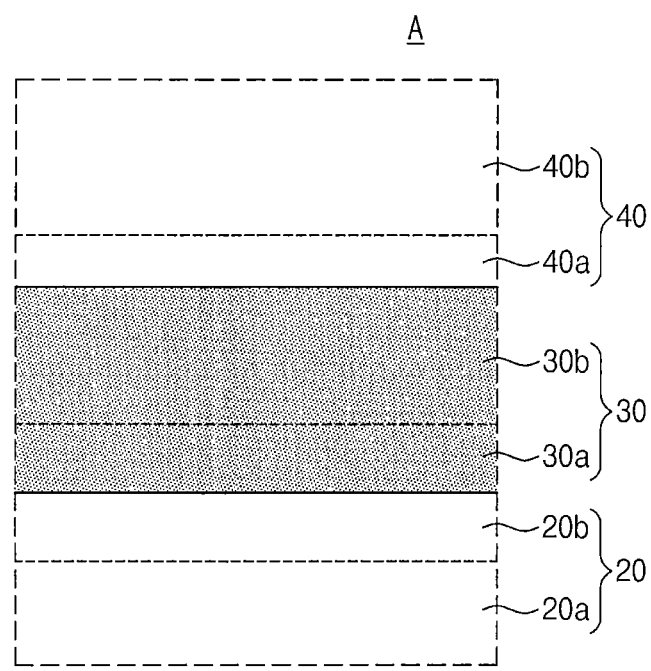
FIG. 5B is an enlarged view of a portion "A" of FIG. 5A.

FIG. 5A is a sectional view taken along a line I-I' of FIG. 4, and FIG. 5B is an enlarged view of a portion "A" of FIG. 5A.

Referring to FIGS. 4, 5A, and 5B, a semiconductor substrate 10 may be provided. The semiconductor substrate 10 may include a single crystalline silicon layer, a silicon on insulator (SOI) wafer, a silicon layer formed on a silicon germanium (SiGe) layer, a single crystalline silicon layer formed on an insulating layer, and/or a poly crystalline silicon layer formed on an insulating layer.

According to some embodiments of the inventive concepts, the nonvolatile memory device may include a string selection gate SSEL_G, a ground selection gate GSEL_G, and a plurality of memory cell gates MC_G that are provided on the semiconductor substrate 10.

The string selection gate SSEL_G, the ground selection gate GSEL_G, and the memory cell gates MC_G may be coupled with the string selection line SSL, the ground selection line GSL, and the word lines WL1-WLn, respectively. The memory cell gates MC_G may be arranged between the string selection gate SSEL_G and the ground selection gate GSEL_G. Each of the memory cell gates MC_G may include a tunnel insulating layer 20, a charge-storing layer 30, a blocking insulating layer 40, and a gate electrode 50 that are sequentially stacked on the semiconductor substrate 10. The string selection gate SSEL_G and the ground selection gate GSEL_G may be provided to have a structure similar to that of the memory cell gate MC_G.

The tunnel insulating layer 20 may include a first tunnel insulating layer 20a on the semiconductor substrate 10 and a second tunnel insulating layer 20b on the first tunnel insulating layer 20a. In certain embodiments, the tunnel insulating layer 20 may be a silicon oxide layer. The tunnel insulating layer 20 may be doped with nitrogen. For example, the tunnel insulating layer 20 may be formed to contain 5 to 20 at. % nitrogen. In the tunnel insulating layer 20, an excessively-high concentration of nitrogen may lead to deterioration of an IVS property, which will be described below. For this reason, the tunnel insulating layer 20 may be formed to have a nitrogen concentration of about 20 at % or lower. In certain embodiments, the first tunnel insulating layer 20a (i.e., the portion of the tunnel insulating layer 20 closest to the substrate 10) may be provided to have a nitrogen concentration that is higher than that of the second tunnel insulating layer 20b (i.e., the portion of the tunnel insulating layer 20 farthest from the substrate 10). Further, the first tunnel insulating layer 20a may have a higher nitrogen concentration at a position adjacent to the second tunnel insulating layer 20b. In the case where there are many nitrogen atoms at an interface between the semiconductor substrate 10 and the tunnel insulating layer 20, it is possible to reduce the number of dangling bonds, which may be generated at the interface between the semiconductor substrate 10 and the tunnel insulating layer 20. In other words, it is possible to improve an interface property between the tunnel insulating layer 20 and the semiconductor substrate 10.

The tunnel insulating layer 20 may be provided to have a thickness capable of satisfying technical requirements for data retention, program, and erase characteristics of a nonvolatile memory cell. A decrease in the thickness of the tunnel insulating layer 20 may lead to deterioration in retention characteristics of the nonvolatile memory device, and an increase in the thickness of the tunnel insulating layer 20 may lead to deterioration in program and erase characteristics of the nonvolatile memory device.

The charge-storing layer 30 may include a first charge-storing layer 30a adjacent to the tunnel insulating layer 20 and a second charge-storing layer 30b adjacent to the blocking insulating layer 40. The first charge-storing layer 30a may be a silicon oxynitride layer. The silicon oxynitride layer for the first charge-storing layer 30a may be formed to have a nitrogen concentration of about 30 at. % or higher. The second charge-storing layer 30b may be a silicon nitride layer. The silicon nitride layer for the second charge-storing layer 30b may be formed to have a nitrogen concentration of about 40 at. % or higher. In certain embodiments, the silicon nitride layer for the second charge-storing layer 30b may be formed to have a nitrogen concentration of about 50 at. %. In addition, the second charge-storing layer 30b may contain silicon atoms, whose concentration is higher than the stoichiometric value (i.e. a silicon-rich SiN layer). Accordingly, the second charge-storing layer 30b may have a trap density higher that is than that of the first charge-storing layer 30a.

Figure 6A:
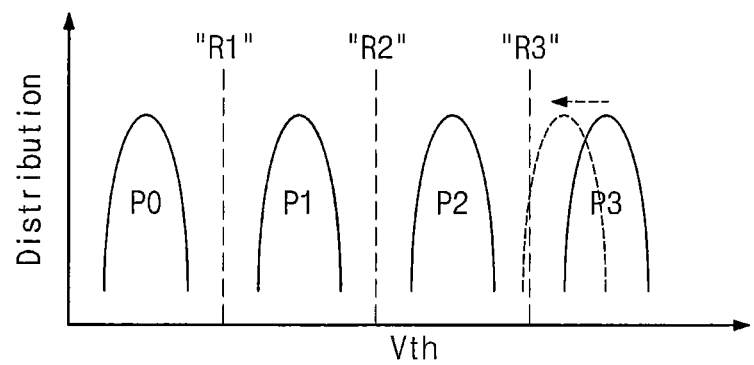
FIGS. 6A and 6B are graphs showing initial voltage shift (IVS) properties of conventional charge-trap-type FLASH memory devices.
Figure 6B:
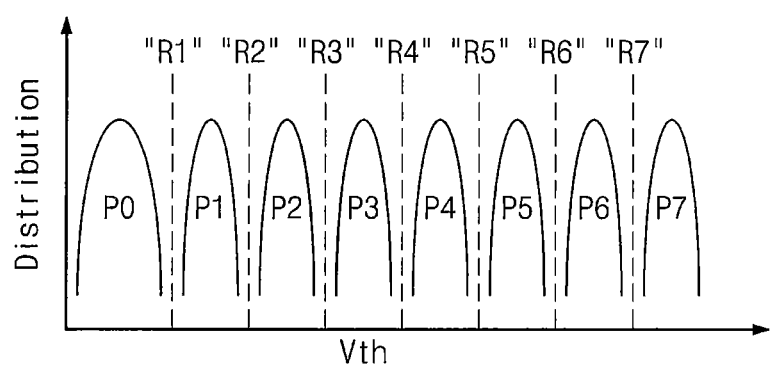

FIGS. 6A and 6B are graphs showing initial voltage shift (IVS) properties of conventional charge-trap-type FLASH memory devices. The IVS represents a phenomenon in which a threshold voltage Vth of at least one of program states P1-P7 is decreased within the first several tens of seconds after a program operation. The IVS phenomenon may result from de-trapping or re-distribution of trapped electrons and/or from de-trapping of electrons trapped in the tunnel insulating layer. In the case that, due to the IVS phenomenon, a memory cell may have a threshold voltage Vth that is lower than a read voltage R1-R7, resulting in failure of the memory cell. Note, for example, the shift in threshold voltages for the memory state P3 shown in FIG. 6A, in which the range of threshold voltages for the memory state includes some threshold voltages that are shifted below the read voltage R3. The IVS phenomenon may lead to a technical difficulty in realizing a charge-trap-type FLASH memory device with multi-level cells (MLC). In particular, a triple level cell (TLC) of FIG. 6B may be vulnerable to the IVS phenomenon, because of its very narrow voltage margin between adjacent program states.

According to some embodiments of the inventive concepts, the second charge-storing layer 30b, which is spaced apart from the tunnel insulating layer 20, has more trap sites than the first charge-storing layer 30a that is adjacent to the tunnel insulating layer 20. This increases the chance that electrons are trapped in an upper portion of the charge-storing layer 30 in a program operation. Because more electrons are trapped in the upper portion of the charge-storing layer 30 that is spaced apart from the tunnel insulating layer 20, it may be possible to reduce the de-trapping of trapped electrons, which may occur during or after the program operation. For example, the first charge-storing layer 30a adjacent to the tunnel insulating layer 20 may be configured to have a reduced trap density, and this makes it possible to suppress movement of electrons trapped in the first charge-storing layer 30a through trap sites of the second charge-storing layer 30b in operation. In addition, the second charge-storing layer 30b, which occupies a greater part of the charge-storing layer, may be configured to have a trap density that is higher than that of the first charge-storing layer 30a. This makes it possible for a total trap density of the charge-storing layer 30 to be higher than a specific value and thereby to improve operational characteristics of program and erase operations.

A distance between the second charge-storing layer 30b and the tunnel insulating layer 20 may be determined by a thickness of the first charge-storing layer 30a. In some embodiments, the first charge-storing layer 30a may have a thickness of from 5 Å to 20 Å. The first charge-storing layer 30a may need to have at least two monolayers in order to function as a charge-storing layer. Thus, the first charge-storing layer 30a may need to have at least a thickness of about 5 Å. If the first charge-storing layer 30a is thick, it is easy to reduce the de-trapping of electrons trapped in the second charge-storing layer 30b. However, if the first charge-storing layer 30a is excessively thick, a distance between the second charge-storing layer 30b and a channel region may be excessively increased, thereby decreasing both of the threshold voltage Vth and the voltage margin between program states. As described above, such a reduction in the threshold voltage Vth may become particularly severe in TLC with a narrow voltage margin between program states. Accordingly, the thickness of the first charge-storing layer 30a may be about 20 Å or less.

In addition, a third charge-storing layer (not shown) may be provided between the second charge-storing layer 30b and the blocking insulating layer 40. The third charge-storing layer (not shown) may be a silicon oxynitride layer. The third charge-storing layer (not shown) may have a thickness of 10 Å or lower.

The blocking insulating layer 40 may include at least one selected from the group consisting of a silicon oxide layer, a silicon nitride layer, an aluminum oxide layer (e.g., $Al_2O_3$), a hafnium aluminate layer (e.g., HfAlO or HfAlON), or a hafnium silicate layer (e.g., HfSiO or HfSiON). The blocking insulating layer 40 may include a silicon oxide layer, a silicon nitride layer, an aluminum oxide layer, and/or a hafnium oxide layer. The blocking insulating layer 40 may include a first blocking insulating layer 40a and a second blocking insulating layer 40b that are sequentially stacked on the semiconductor substrate 10. For example, the first and second blocking insulating layers 40a and 40b may be a silicon oxide layer and an aluminum oxide layer, respectively.

The gate electrode 50 may include at least one of doped polysilicon, metals (e.g., tungsten, cobalt, or molybdenum), conductive metal nitrides (e.g., tungsten nitride, titanium nitride, tantalum nitride, or molybdenum nitride), or metal silicides (e.g., tungsten silicide or cobalt silicide).

Each of the plurality of memory blocks BLK0-BLKn described with reference to FIGS. 1 and 2 may include a three-dimensional structure or a vertical structure. For example, each memory block may include structures extending along first to third directions crossing each other. In certain embodiments, each memory block may include a plurality of cell strings extending along the third direction.

Figure 7:
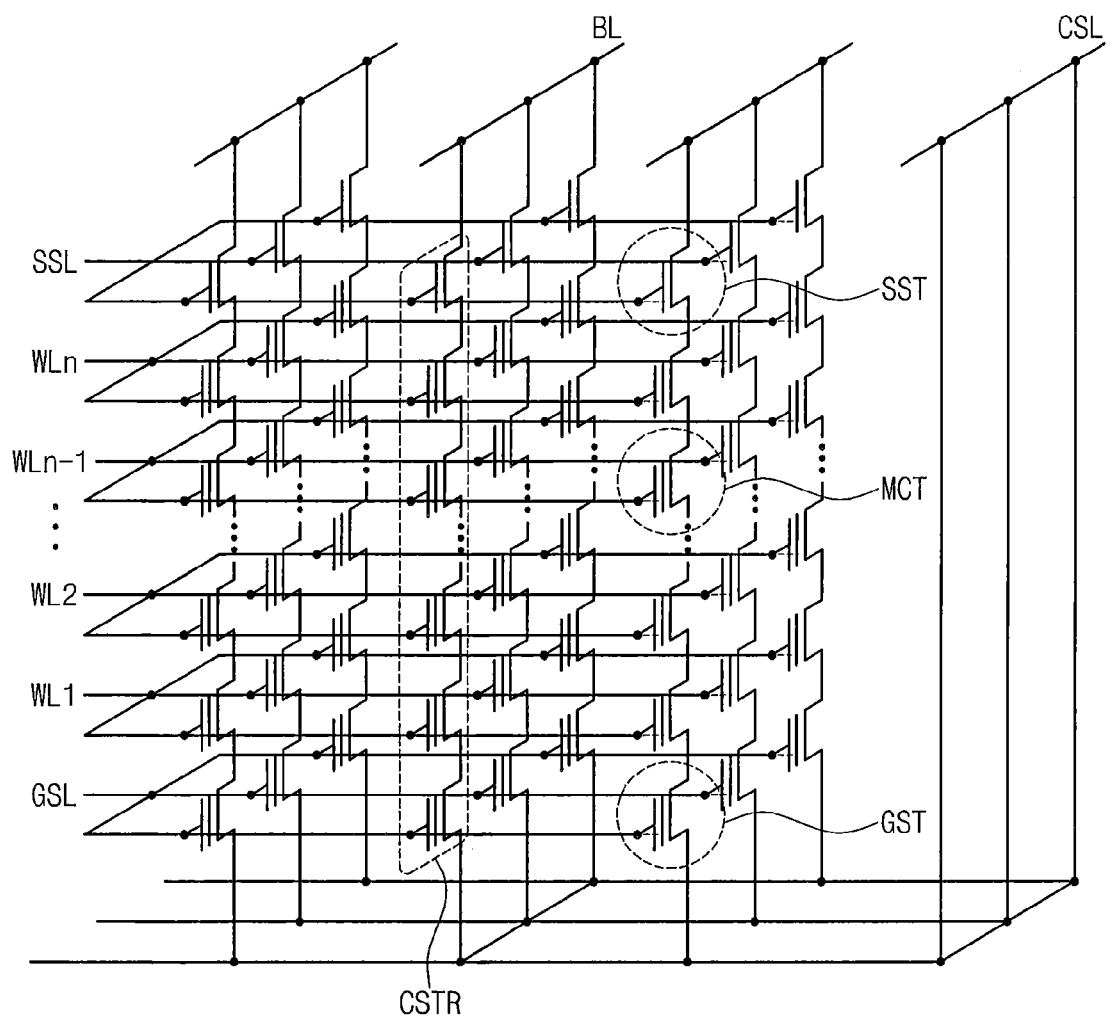
FIG. 7 is a schematic circuit diagram illustrating a memory cell array of a nonvolatile memory device according to some embodiments of the inventive concept.

FIG. 7 is a schematic circuit diagram illustrating a memory cell array of a nonvolatile memory device according to some embodiments of the inventive concept. Referring to FIG. 7, a semiconductor device may include the common source line CSL, the bit lines BL, and the plurality of cell strings CSTR disposed between the common source line CSL and the bit lines BL. The plurality of cell strings CSTR may be connected in parallel to each of the bit lines BL.

Each of the cell strings CSTR may include the ground selection transistor GST coupled to the common source line CSL, the string selection transistor SST coupled to each of the bit lines BL, and the plurality of memory cell transistors MCT interposed between the selection transistors GST and SST. The ground selection transistor GST, the string selection transistor SST, and the memory cell transistors MCT may be connected in series. The ground selection line GSL, the plurality of word lines WL1-WLn, and the string selection line SSL may serve as gate electrodes of the ground selection transistor GST, the memory cell transistors MCT, and the string selection transistor SST, respectively.

Figure 8A:
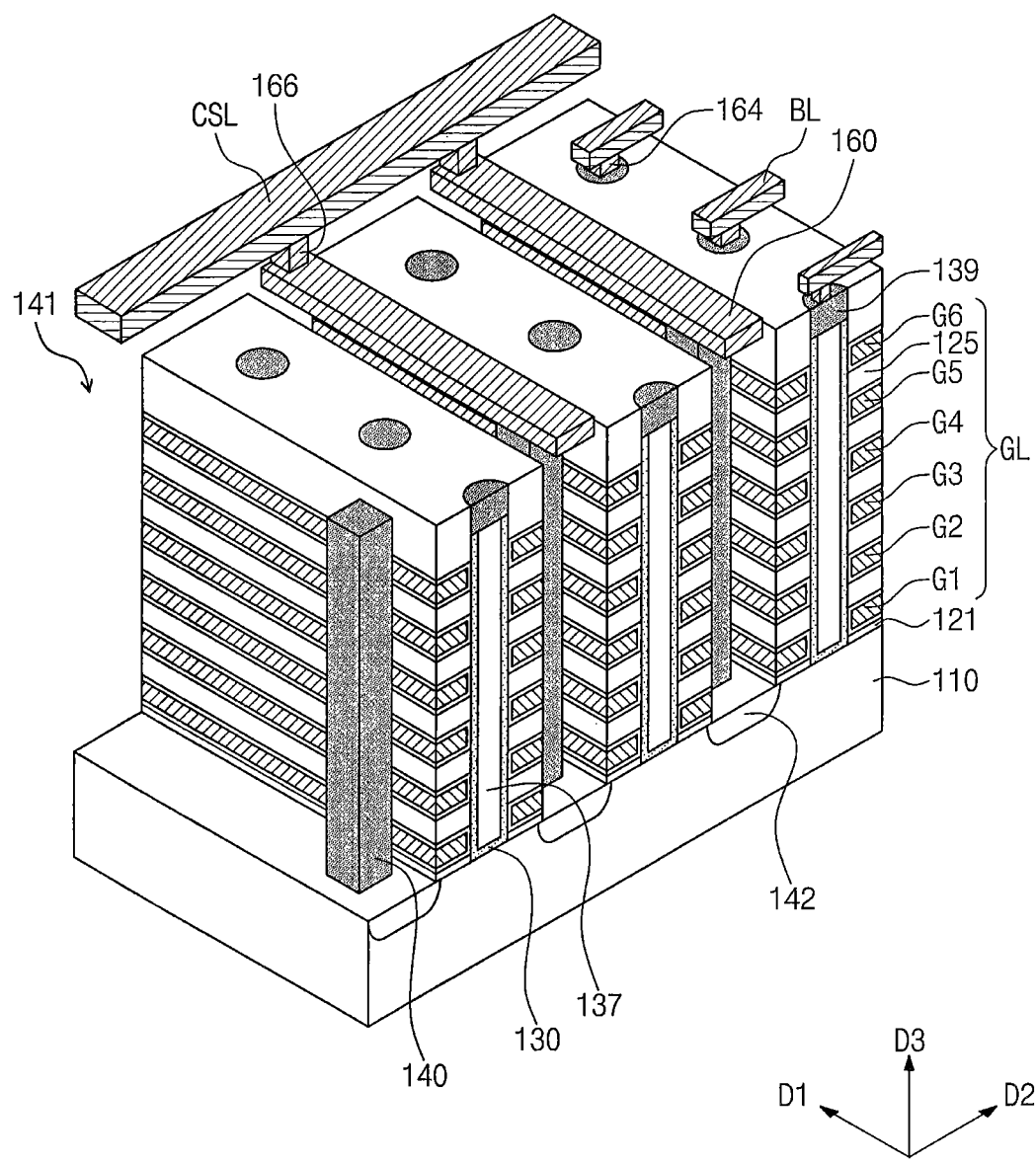
FIGS. 8A and 8B are perspective and plan views illustrating a nonvolatile memory device according to some embodiments of the inventive concept.
Figure 8B:
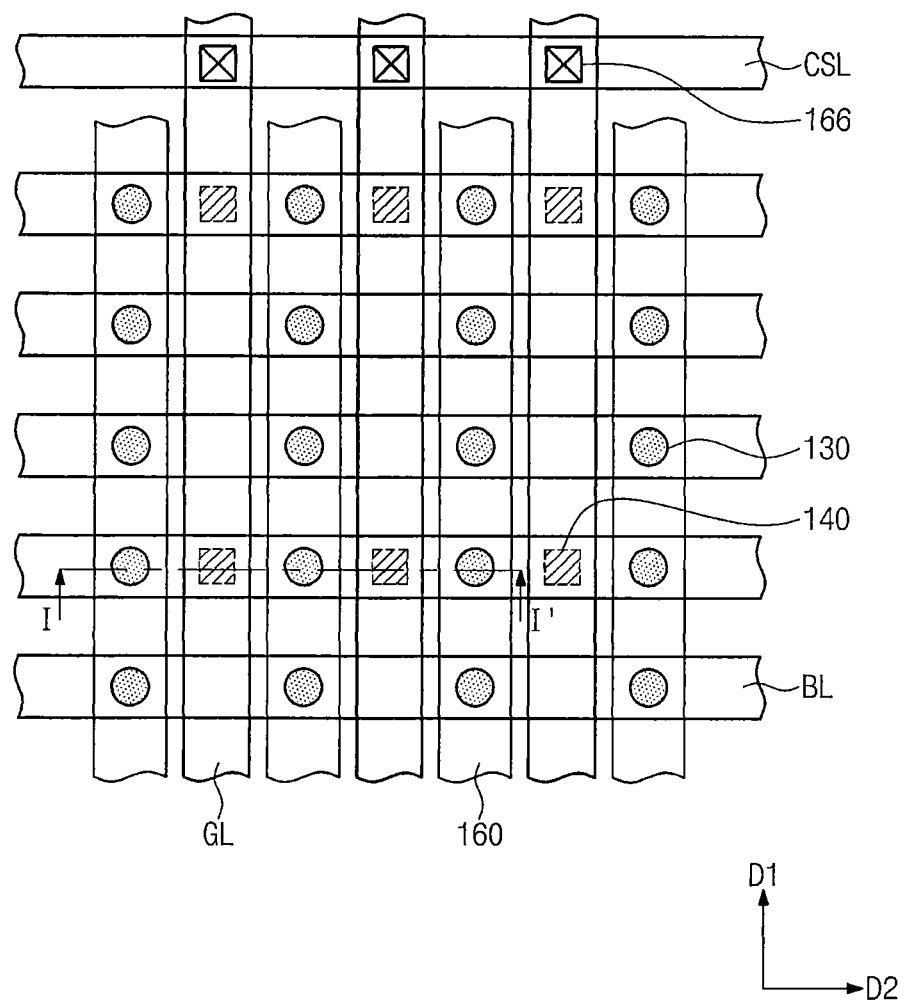
Figure 8C:
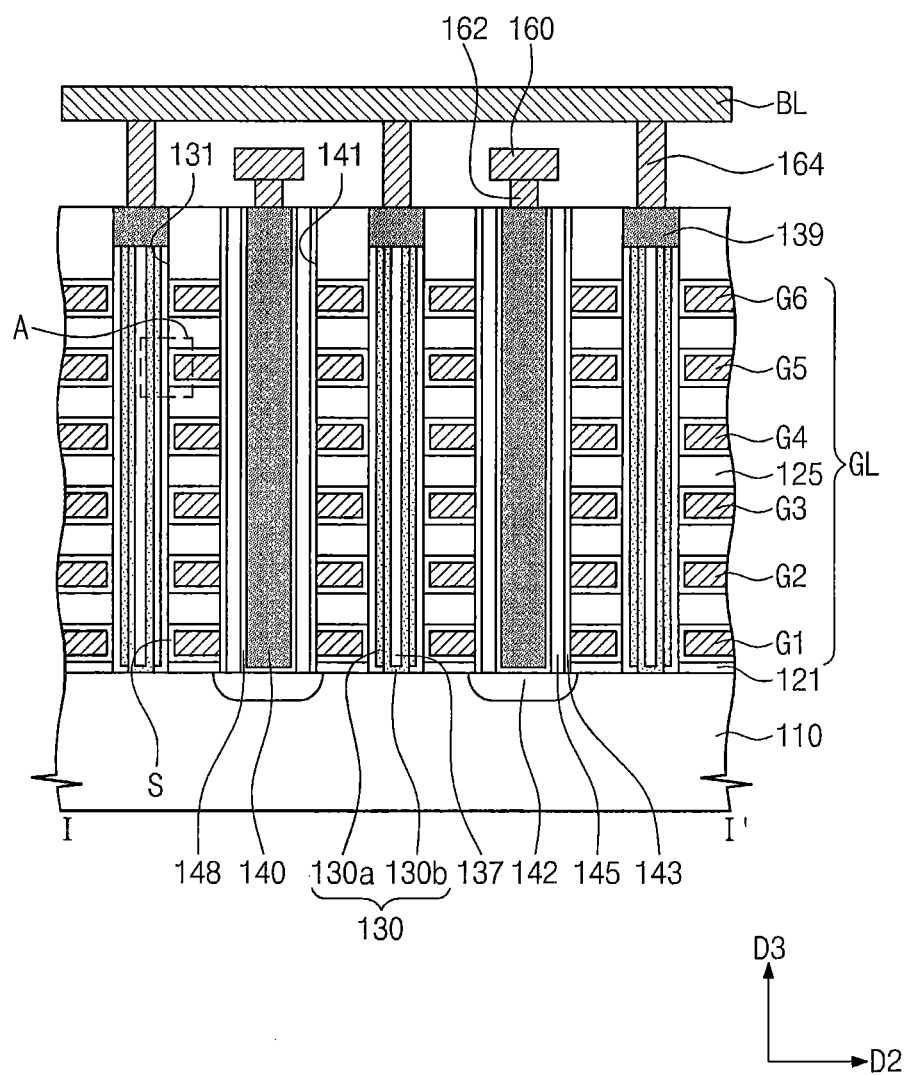
FIG. 8C is a sectional view taken along a line I-I' of FIG. 8B.
Figure 8D:
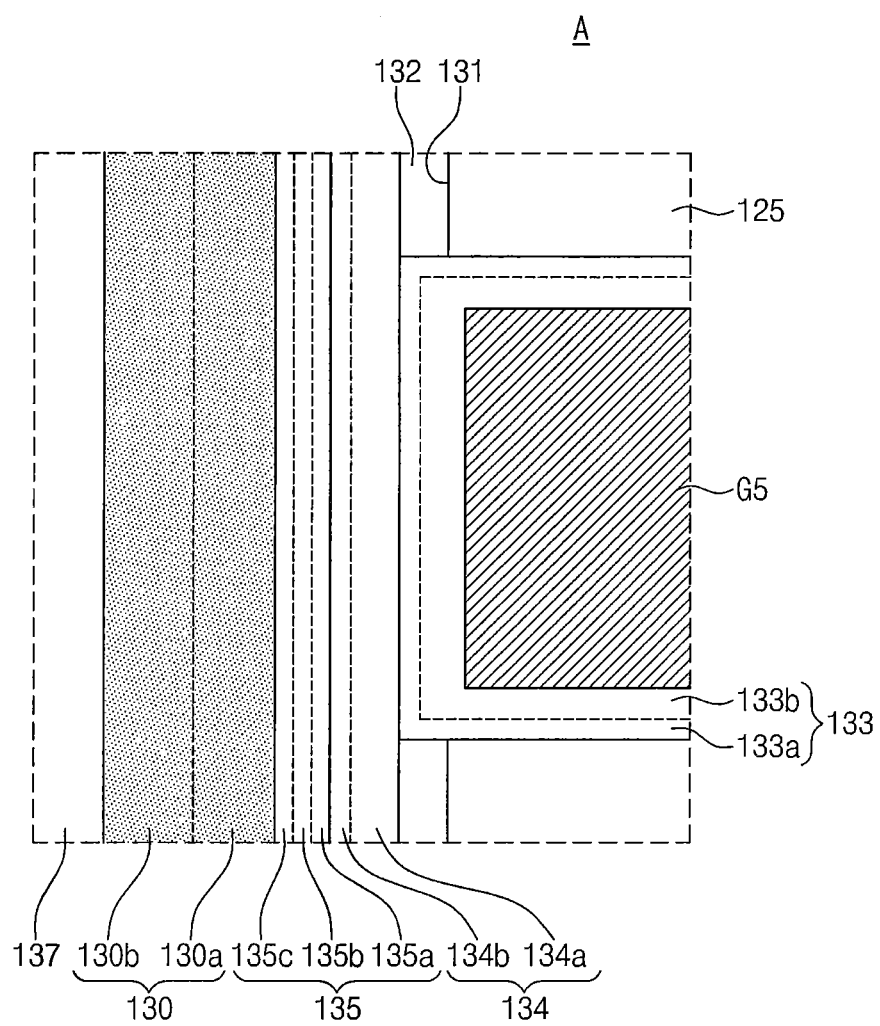
FIG. 8D is an enlarged view of a portion "A" of FIG. 8C.

FIGS. 8A and 8B are perspective and plan views illustrating a nonvolatile memory device according to some embodiments of the inventive concept, FIG. 8C is a sectional view taken along a line I-I' of FIG. 8B, and FIG. 8D is an enlarged view of a portion "A" of FIG. 8C.

Referring to FIG. 7 and FIGS. 8A through 8D, a substrate 110 may be provided. The substrate 110 may be a semiconductor substrate having a first conductivity type (e.g., p-type). The semiconductor substrate may include at least one selected from the group consisting of a single crystalline silicon layer, a silicon on insulator (SOI) wafer, a silicon layer formed on a silicon germanium (SiGe) layer, a single crystalline silicon layer formed on an insulating layer, and a poly crystalline silicon layer formed on an insulating layer. Gate structures GL may be provided on the substrate 110. A buffer dielectric layer 121 may be provided between the substrate 110 and the gate structures GL. The buffer dielectric layer 121 may be a silicon oxide layer.

Each of the gate structures GL may extend along a first direction D1. A separation trench 141 extending parallel to the first direction D1 may be provided between gate structures GL, and thus, the gate structures GL may be spaced apart from each other in a second direction D2 that is across or perpendicular to the first direction D1. Each of the gate structures GL may include inter-gate insulating patterns 125 and gate electrodes between the inter-gate insulating patterns 125. The gate electrodes may include first to sixth gate electrodes G1-G6 sequentially stacked on the substrate 110. The inter-gate insulating patterns 125 may be formed of or include a silicon oxide layer. The buffer dielectric layer 121 may be thinner than the inter-gate insulating patterns 125. The gate electrodes G1-G6 may include at least one of doped silicon, metals (e.g., tungsten), metal nitrides, metal silicides, or any combination thereof. Although six gate electrodes are illustrated, the number of the gate electrodes constituting each gate structure GL may be greater or smaller than six.

A plurality of vertical active pillars 130 may be coupled to the gate structures GL. The vertical active pillars 130 may be provided in vertical holes 131, respectively, which are formed to penetrate the gate electrodes G1-G6, and may be connected to the substrate 110. Each of the vertical active pillars 130 may be formed to have a longitudinal axis extending upward from the substrate 110 (for example, toward a third direction). Each of the vertical active pillars 130 may include opposite end portions, one of which is connected to the substrate 110, and the other of which is connected to a corresponding one of the bit lines BL extending along the second direction D2. Each of the vertical active pillars 130 may include a first semiconductor layer 130a provided on a sidewall of the vertical hole 131 and a second semiconductor layer 130b provided on an inner side surface of the first semiconductor layer 130a. The first and second semiconductor layers 130a and 130b may be formed of a silicon layer having the first conductivity type. Each of the vertical active pillars 130 may serve as an active region (for example, of a MOS-type transistor). The vertical active pillars 130 may be shaped like a solid cylinder, or a hollow cylinder, although other shapes are possible. In the case where the vertical active pillar is shaped like the hollow cylinder, an inside thereof may be filled with a filling insulating layer 137. In certain embodiments, the filling insulating layer 137 may be formed of silicon oxide. Conductive patterns 139 may be provided on the vertical active pillars 130, respectively. Portions of the vertical active pillars 130 in contact with the conductive patterns 139 may serve as drain regions (for example, of the MOS-type transistors or the cell strings).

A protection layer 132 may be provided on a sidewall of the inter-gate insulating patterns 125. The protection layer 132 may be formed on a silicon oxide layer.

A data storing element S may be provided between the gate electrodes G1-G6 and the vertical active pillars 130. The data storing element S may include a blocking insulating layer 133 adjacent to the gate electrode, a tunnel insulating layer 135 adjacent to the vertical active pillars 130, and a charge-storing layer 134 therebetween.

The blocking insulating layer 133 may include a high-k dielectric material, such as aluminum oxide or hafnium oxide. The blocking insulating layer 133 may have a multi-layered structure including a plurality of thin-films. The blocking insulating layer 133 may include a first blocking insulating layer 133a and a second blocking insulating layer 133b. For example, the first blocking insulating layer 133a may be a silicon oxide layer, and the second blocking insulating layer 133b may be an aluminum oxide layer and/or a hafnium oxide layer. The blocking insulating layer 133 may extend between the inter-gate insulating patterns 125 and the gate electrodes G1-G6. Alternatively, at least a portion of the blocking insulating layer 133 may extend between the inter-gate insulating patterns 125 and the vertical active pillars 130. As shown in FIG. 8D, both of the first and second blocking insulating layers 133a and 133b may extend between the inter-gate insulating patterns 125 and the gate electrodes G1-G6.

The charge-storing layer 134 may include a first charge-storing layer 134a adjacent to the blocking insulating layer 133 and a second charge-storing layer 134b adjacent to the tunnel insulating layer 135. The first charge-storing layer 134a may be a silicon nitride layer. The first charge-storing layer 134a may be formed to have a nitrogen concentration of about 40 at. % or higher. The first charge-storing layer 134a may be formed to have a nitrogen concentration of about 50 at. % or higher. Further, the first charge-storing layer 134a may be formed in such a way that a silicon concentration thereof is higher than the stoichiometric value. Stoichiometric silicon nitride has an atomic percentage of silicon of about 43% and an atomic percentage of nitrogen of about 57%. The second charge-storing layer 134b may be a silicon oxynitride layer. The second charge-storing layer 134b may be formed to have a nitrogen concentration of about 30 at. % or higher. Accordingly, a trap density of the first charge-storing layer 134a may be higher than that of the second charge-storing layer 134b.

According to some embodiments of the inventive concepts, since the first charge-storing layer 134a, which is spaced apart from the tunnel insulating layer 135, has more trap sites, the chance that electrons are trapped in the first charge-storing layer 134a during a program operation is increased. Accordingly, it may be possible to reduce the de-trapping of trapped electrons, which may occur during or after the program operation. For example, the second charge-storing layer 134b, which is adjacent to the tunnel insulating layer 135, may be configured to have a reduced trap density, which makes it possible to suppress the movement of electrons that are trapped in the first charge-storing layer 134a through trap sites in the second charge-storing layer 134b during device operation. In addition, the first charge-storing layer 134a, which occupies a greater part of the charge-storing layer 134, may be configured to have a trap density higher than that of the second charge-storing layer 134b, which makes it possible to maintain in such a way that a total trap density of the charge-storing layer 134 is higher than a specific value and thereby to improve operational characteristics of program and erase operations.

A distance between the first charge-storing layer 134a and the tunnel insulating layer 135 may be determined by a thickness of the second charge-storing layer 134b. The second charge-storing layer 134b may be formed to have a thickness ranging from 5 Å to 20 Å. The second charge-storing layer 134b may need to have at least two monolayers. Thus, the second charge-storing layer 134b may need to have at least a thickness of at least about 5 Å as function as a charge-storing layer. If the second charge-storing layer 134b is thick, it is possible to reduce the de-trapping of trapped electrons. However, if the second charge-storing layer 134b is excessively thick, a distance between the first charge-storing layer 134a and the vertical active pillars 130 serving as a channel region may be excessively increased, thereby decreasing both of the threshold voltage Vth and the voltage margin between program states. As described above, such a reduction in the threshold voltage Vth may become particularly severe in TLC having a narrow voltage margin between the program states. For this reason, the second charge-storing layer 134b may be formed to have a thickness of about 20 Å or less. Further, in a vertical-type FLASH memory device, it may be needed to reduce a size of the vertical hole 131 and a thickness of the gate structure GL. In other words, if the gate structure GL is excessively thick, it may be difficult to form the vertical holes 131. In particular, in the case where a portion of the charge-storing layer 134 extends between the gate electrodes and the inter-gate insulating patterns 125, the use of the charge-storing layer 134 with large thickness may result in an increase in thickness of the gate structure GL. Since electrons are trapped in the first charge-storing layer 134a, it is hard to reduce the thickness of the first charge-storing layer 134a. For this reason, it may be desired to reduce the thickness of the second charge-storing layer 134b. For example, an upper limit of the thickness of the second charge-storing layer 134b may be about 20 Å.

In addition, a third charge-storing layer (not shown) may be provided between the first charge-storing layer 134a and the blocking insulating layer 132. The third charge-storing layer (not shown) may be a silicon oxynitride layer and may have a thickness of 10 Å or lower.

The charge-storing layer 134 may extend between the inter-gate insulating patterns 125 and the vertical active pillars 130. In other embodiments, at least a portion of the charge-storing layer 134 may be interposed between the inter-gate insulating patterns 125 and the gate electrode.

The tunnel insulating layer 135 may be configured in such a way that an energy band gap thereof decreases and then increases with increasing distance from the charge-storing layer 133. The tunnel insulating layer 135 may include a first tunnel insulating layer 135a, a second tunnel insulating layer 135b, and a third tunnel insulating layer 135c sequentially stacked on the charge-storing layer 134. The third tunnel insulating layer 135c may have an energy band gap that is larger than that of the second tunnel insulating layer 135b. The third tunnel insulating layer 135c may have an energy band gap that is smaller than that of the first tunnel insulating layer 135a. The first to third tunnel insulating layers 135a, 135b, and 135c may include a silicon oxide layer. The tunnel insulating layer 135 may be formed to have a nitrogen concentration of 5 at. % to 20 at. %. The second and third tunnel insulating layers 135b and 135c may be formed to have a nitrogen concentration that is higher than that of the first tunnel insulating layer 135a. The second tunnel insulating layer 135b may be formed to have a nitrogen concentration higher than that of the third tunnel insulating layer 135c. The first tunnel insulating layer 135a may be formed to have a nitrogen concentration much lower than that of the second charge-storing layer 134b.

The first tunnel insulating layer 135a may have an energy band gap that is much larger than that of the second charge-storing layer 134b. It is advantageous to preserve the electrons, which are trapped in the program operation, in the first charge-storing layer 134a or the charge-storing layer 134.

Moreover, since there are many nitrogen atoms in the interface between the vertical active pillars 130 and the tunnel insulating layer 135, it is possible to reduce the number of dangling bonds existing at the interface of the silicon layer of the vertical active pillar and the tunnel insulating layer 135.

As shown in FIG. 8D, a portion of the data storing element S (for example, the blocking insulating layer 133) may extend between the gate electrodes G1-G6 and the inter-gate insulating patterns 125, and another portion of the data storing element S (for example, the charge-storing layer 134 and the tunnel insulating layer 135) may extend between the inter-gate insulating patterns 125 and the vertical active pillars 130. However, the inventive concepts may not be limited thereto, as will be described with reference to FIGS. 15A through 15E.

The plurality of cell strings CSTR of the FLASH semiconductor device may be provided between the bit lines BL and the common source lines CSL. Each of the cell strings CSTR may include the string selection transistor SST, the ground selection transistor GST, and the plurality of memory cells MCT. The selection transistors SST and GST and the plurality of memory cells MCT may be coupled to each of the vertical active pillars 130. The first gate electrode G1 may be the ground selection line GSL of the ground selection transistor GST. The second to fifth gate electrodes G2-G5 may be used as the word lines WL1-WLn of the memory cells MCT. The sixth gate electrode G6 may be uses as the string selection gate line SSL of the string selection transistor SST.

Referring to FIG. 8C, the separation trenches 141 may be formed between the gate structures GL and may extend parallel to the first direction D1. Common source regions 142 may be provided in portions of the substrate 110 exposed by the separation trenches 141. The common source regions 142 may be spaced apart from each other and may extend parallel to the first direction D1 in the substrate 110. The common source regions 142 may be formed to have a second conductivity type (e.g., n-type) that is different from the first conductivity type. Device isolation patterns 145 may be provided on the common source regions 142 to fill the separation trenches 141. The device isolation patterns 145 may include a silicon oxide layer. The common contact layers (not shown) may be provided between the device isolation pattern 145 and the common source regions 142. The common contact layers (not shown) may be formed of a metal-semiconductor compound layer. For example, the common contact layers may be formed of a metal silicide layer. An insulating spacer 143 may be provided on the sidewall of the gate structure GL. The insulating spacer 143 may be disposed between the sidewall of the gate structure GL and the device isolation pattern 145. The insulating spacer 143 may include at least one of a silicon oxide layer, a silicon oxynitride layer, a silicon nitride layer, and/or an aluminum oxide layer.

Strapping plugs 140 may be provided to penetrate the device isolation pattern 145 and may be electrically connected to the common source regions 142. The strapping plugs 140 may be arranged along the first direction D1. A barrier layer 148 may be provided between the strapping plugs 140 and the device isolation pattern 145. The strapping plugs 140 may include a metal layer (e.g., of tungsten, copper, or aluminum). The barrier layer 148 may include a conductive metal nitride layer (e.g., of titanium nitride or tantalum nitride). Common contact layers (not shown) may be provided between the strapping plugs 140 and the common source regions 142.

A strapping line 160 may be provided on the device isolation pattern 145 and may extend parallel to the first direction D1. The strapping line 160 may be electrically connected to the strapping plugs 140 through first contacts 162. The strapping line 160 and the first contacts 162 may include at least one selected from the group consisting of metals (e.g., tungsten, copper, or aluminum), conductive metal nitrides (e.g., titanium nitride or tantalum nitride), or transition metals (e.g., titanium or tantalum).

The bit lines BL may be provided on the strapping line 160 and may extend parallel to the second direction D2. The bit lines BL may be electrically connected to the vertical active pillars 130 through second contacts 164. The bit lines BL and the second contacts 164 may include at least one selected from the group consisting of metals (e.g., tungsten, copper, or aluminum), conductive metal nitrides (e.g., titanium nitride or tantalum nitride), or transition metals (e.g., titanium or tantalum).

The common source line CSL may be provided on the strapping line 160 and may extend parallel to the second direction D2. The common source line CSL may be electrically connected to the strapping line 160 through third contacts 166. The common source line CSL and the third contacts 166 may include at least one selected from the group consisting of metals (e.g., tungsten, copper, or aluminum), conductive metal nitrides (e.g., titanium nitride or tantalum nitride), or transition metals (e.g., titanium or tantalum).

Methods of fabricating the nonvolatile memory device according to some embodiments of the inventive concepts will now be described with reference to FIGS. 9A through 14A and 9B through 14B. FIGS. 9A through 14A are sectional views taken along a line I-I' of FIG. 8B, and FIGS. 9B through 14B are enlarged views of portions "A" of FIGS. 9A through 14A, respectively.

Figure 9A:
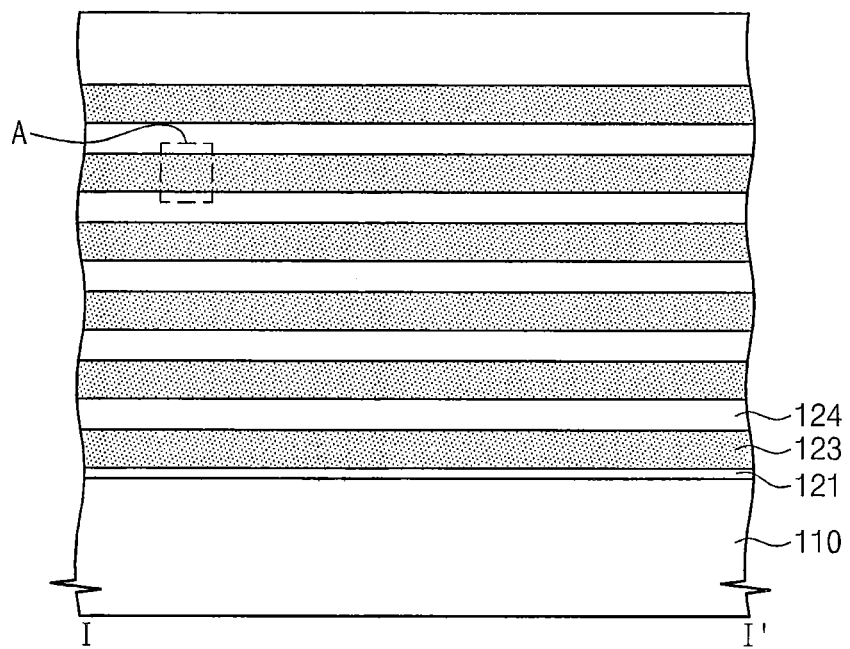
Figure 9B:
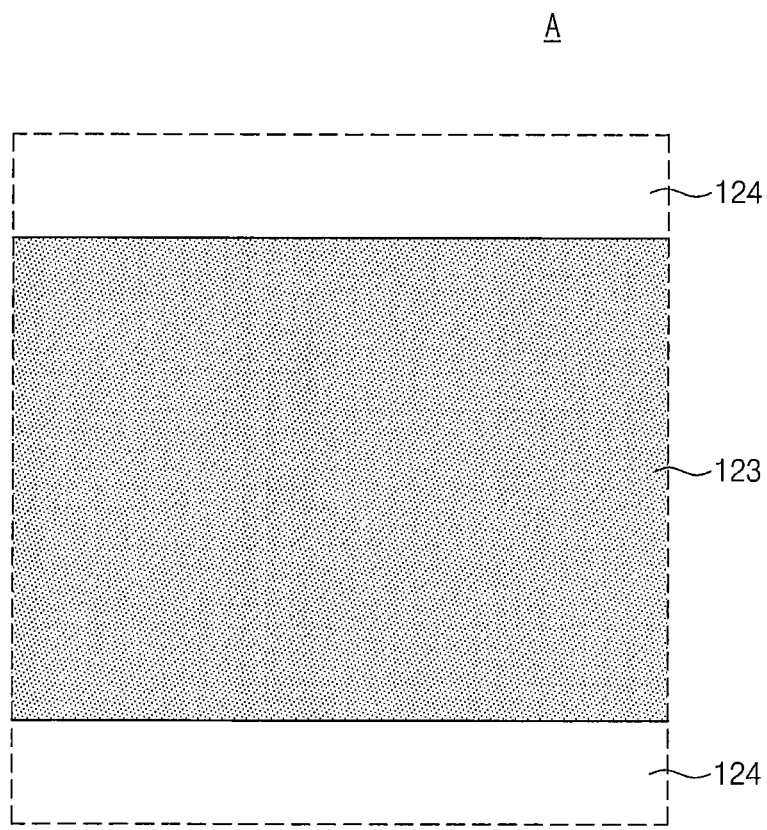

Referring to FIGS. 9A and 9B, the substrate 110 may be provided. The substrate 110 may be a semiconductor substrate of a first conductivity type, e.g., P-type. The semiconductor substrate may include at least one selected from the group consisting of a single crystalline silicon layer, a silicon on insulator (SOI) wafer, a silicon layer formed on a silicon germanium (SiGe) layer, a single crystalline silicon layer formed on an insulating layer, and a poly crystalline silicon layer formed on an insulating layer. The buffer dielectric layer 121 may be formed on the substrate 110. The buffer dielectric layer 121 may include, for example, silicon oxide. The buffer dielectric layer 121 may be formed by, for example, a thermal oxidation process. Sacrificial layers 123 and insulating layers 124 may be alternately stacked on the buffer dielectric layer 121. The thickness of an uppermost insulating layer may be greater than those of the other insulating layers. The insulating layers 124 may include, for example, silicon oxide. The sacrificial layers 123 may include materials, whose wet etch properties are different from those of the buffer dielectric layer 121 and the insulating layers 124. The sacrificial layers 123 may include, for example, silicon nitride, silicon oxynitride, polysilicon, or polysilicon germanium. The sacrificial layers 123 and the insulating layers 124 may be formed by, for example, a chemical vapor deposition (CVD) process.

Figure 10A:
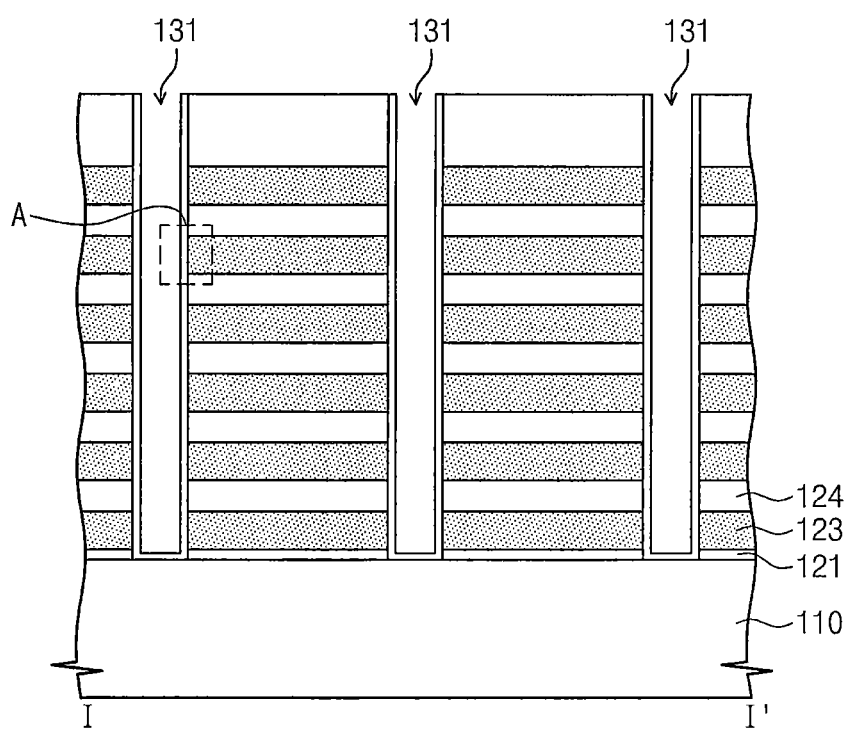
Figure 10B:
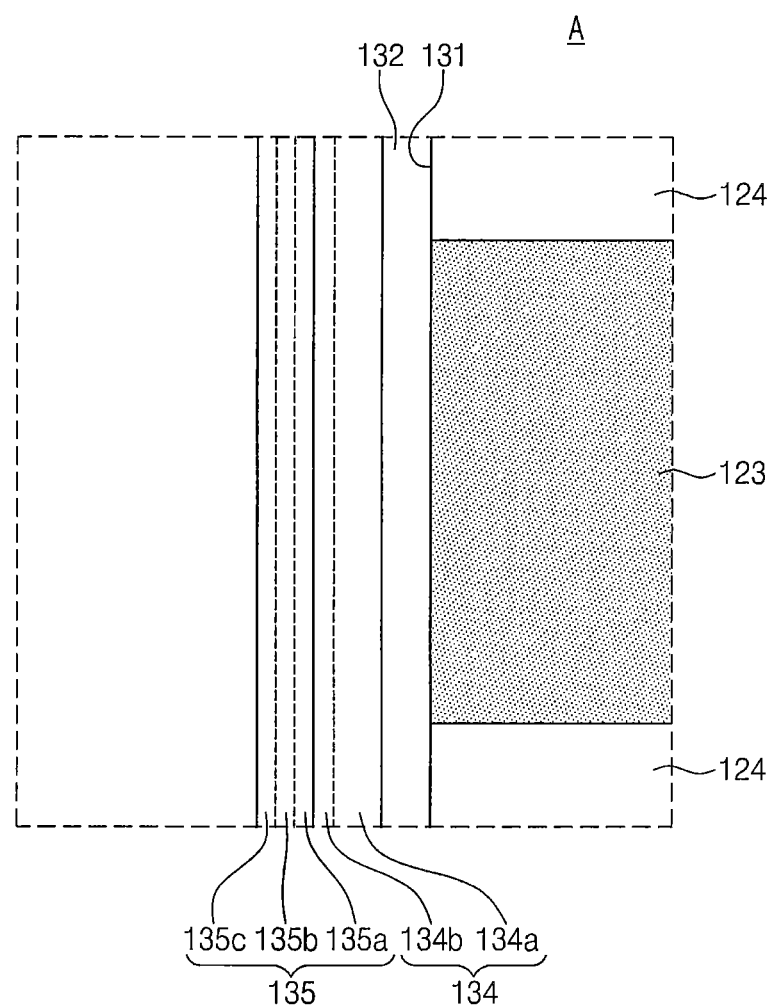

Referring to FIGS. 10A and 10B, the vertical holes 131 may be formed to penetrate the buffer dielectric layer 121, the sacrificial layers 123, and the insulating layers 124 and expose the substrate 110. The protection layer 132 may be formed on the sidewalls of the vertical holes 131. The protection layer 132 may be formed of or include a silicon oxide layer.

The charge-storing layer 134 may be formed on the protection layer 132. The formation of the charge-storing layer 134 may include forming the first charge-storing layer 134a on the protection layer 132 and forming the second charge-storing layer 134b on the first charge-storing layer 134a. The first charge-storing layer 134a may be a silicon nitride layer. The first charge-storing layer 134a may be formed to have a nitrogen concentration of about 40 at. % or higher. The first charge-storing layer 134a may be formed to have a nitrogen concentration of about 50 at. % or higher. Further, the first charge-storing layer 134a may be formed in such a way that a silicon concentration thereof is higher than the stoichiometric value. The second charge-storing layer 134b may be a silicon oxynitride layer. The second charge-storing layer 134b may be formed to have a nitrogen concentration of about 30 at. % or higher. Accordingly, the first charge-storing layer 134a may be formed to have a trap density that is higher than that of the second charge-storing layer 134b. The charge-storing layer 134 having the multi-layered structure may be formed by an ALD process, in which $Si_2Cl_6$, $NH_3$, and $N_2O$ are used as silicon, nitrogen, and oxygen source gases, respectively. Nitrogen concentrations and thicknesses of the first and second charge-storing layers 134a and 134b may be controlled by adjusting process conditions such as flow rates and/or supplying times of source gases.

In addition, a third charge-storing layer (not shown) may be formed between the second charge-storing layer 134b and the blocking insulating layer 133. The third charge-storing layer (not shown) may be formed to have a thickness of 10 Å or lower.

The tunnel insulating layer 135 may be formed on the charge-storing layer 134. The tunnel insulating layer 135 may include the first tunnel insulating layer 135a, the second tunnel insulating layer 135b, and the third tunnel insulating layer 135c. A process of forming the tunnel insulating layer 135 will be described in more detail below.

First, a first preliminary tunnel insulating layer, a second preliminary tunnel insulating layer, and a third preliminary tunnel insulating layer may be sequentially formed on the charge-storing layer 134. The preliminary tunnel insulating layers may be formed in such a way that an energy band gap thereof decreases with increasing distance from the charge-storing layer 134. The preliminary tunnel insulating layers may be a nitrogen-containing silicon oxide layer. A concentration of nitrogen atoms contained in the silicon oxide layer may be increased in order of the first, second, and third preliminary tunnel insulating layers.

Thereafter, a thermal treatment process may be performed. The thermal treatment process may include an oxidation process. For example, the thermal treatment process may be performed under oxygen ambient. In example embodiments, the thermal treatment process may be performed in an ambient containing N2O or NO gas. The thermal treatment process may be performed using, for example, a radical oxidation process or a plasma oxidation process. The thermal treatment process may be performed at temperature of about 750-950° C. By performing the thermal treatment process, it is possible to supply more oxygen into the third preliminary tunnel insulating layer than into the second preliminary tunnel insulating layer.

The first, second, and third tunnel insulating layers 135a, 135b, and 135c may be sequentially formed on the charge-storing layer 134. As the result of the thermal treatment process, the first tunnel insulating layer 135a may be formed to have a nitrogen concentration lower than those of the second and third tunnel insulating layers 135b and 135c. The third tunnel insulating layer 135c may be formed to have a nitrogen concentration lower than that of the second tunnel insulating layer 135b. By adjusting the nitrogen concentrations of the first, second, and third tunnel insulating layers 135a, 135b, and 135c, it is possible to control the tunnel insulating layer 135 in such a way that an energy band gap thereof decreases and then increases with increasing distance from the charge-storing layer 134. In other words, the third tunnel insulating layer 135c may have an energy band gap that is larger than that of the second tunnel insulating layer 135b and is smaller than that of the first tunnel insulating layer 135a.

As the result of the above process, the first tunnel insulating layer 135a adjacent to the charge-storing layer 134 may have a nitrogen concentration that is much lower than that of the second charge-storing layer 134b. The first tunnel insulating layer 135a may have an energy band gap that is much larger than that of the second charge-storing layer 134b. This may provide a technical advantage in preserving the electrons, which are trapped in the program operation, in the charge-storing layer 134.

Moreover, since there are many nitrogen atoms in the interface between the vertical active pillars 130 (e.g., of FIGS. 11A and 11B) and the tunnel insulating layer 135, it is possible to reduce the number of dangling bonds existing at the interface of the silicon layer of the vertical active pillar and the tunnel insulating layer 135. Further, it is possible to improve an interface property between the tunnel insulating layer 135 and the silicon layer of the vertical active pillar, in a process of forming a reverse-type tunnel insulating layer according to example embodiments of the inventive concept. Accordingly, it is possible to improve retention and endurance characteristics of the reverse-type tunnel insulating layer according to example embodiments of the inventive concept.

Further, the thermal treatment process may contribute to cure or remove defects formed in the charge-storing layer 134.

Figure 11A:
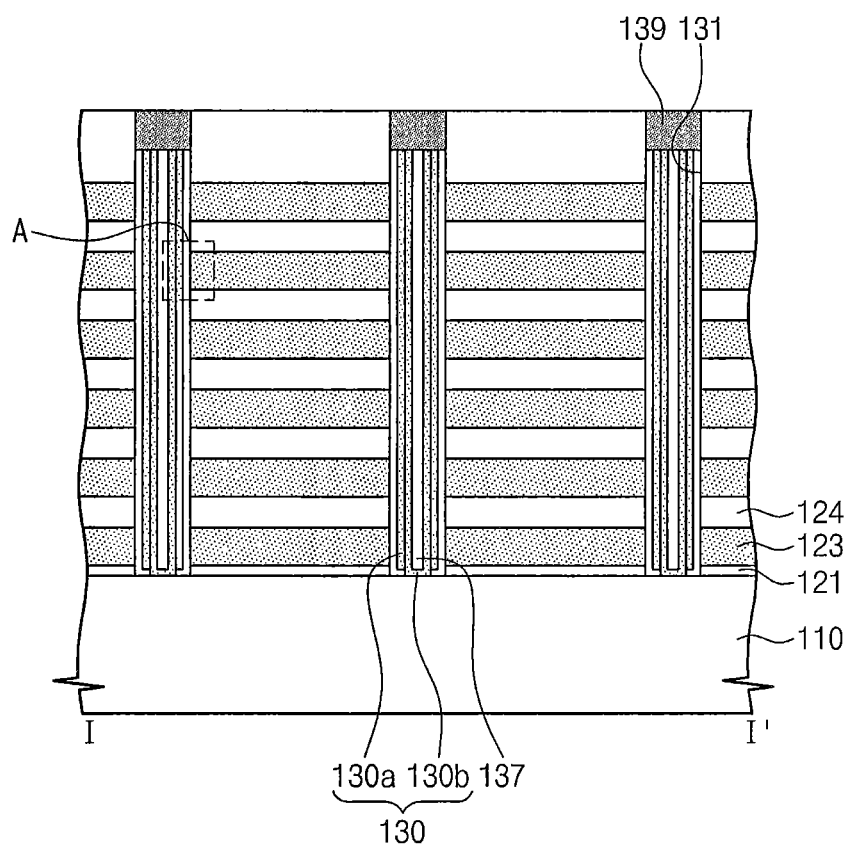
Figure 11B:
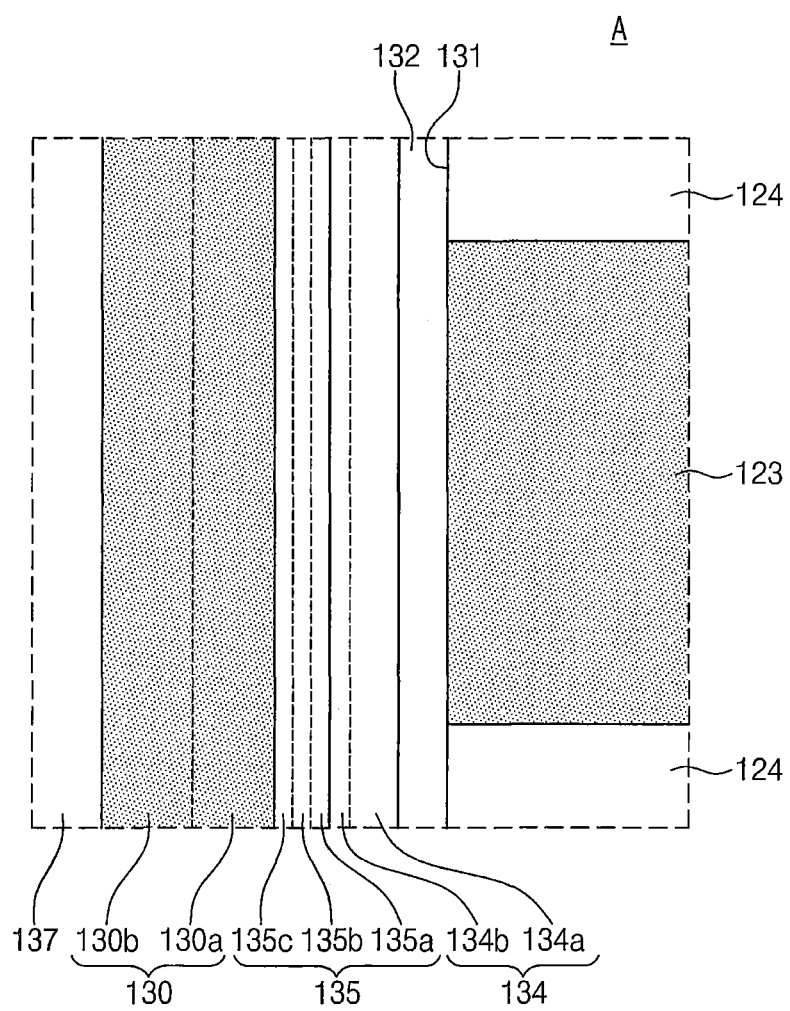

Referring to FIGS. 11A and 11B, the vertical active pillars 130 may be formed on the tunnel insulating layer 135 in the vertical holes 131. The formation of the vertical pillars 130 will be described in detail below. First, the first semiconductor layer 130a may be formed on the tunnel insulating layer 135. The first semiconductor layer 130a may be anisotropically etched to expose the substrate 110. Accordingly, the first semiconductor layer 130a may form a semiconductor spacer remaining on the sidewall of the tunnel insulating layer 135. The second semiconductor layer 130b may be formed on the semiconductor spacer. The first and second semiconductor layers 130a and 130b may be formed by a CVD or ALD method. The first and second semiconductor layers 130a and 130b may be an amorphous silicon layer. A thermal treatment process may be performed to transform the first and second semiconductor layers 130a and 130b into a poly-silicon or crystalline silicon layer. The vertical pillars 130 may be semiconductor layers of the first conductivity type.

The semiconductor layer may be formed to partially or incompletely fill the vertical holes 131, and an insulating material may be formed on the semiconductor layer to fill the vertical holes 131. The semiconductor layer and the insulating material may be planarized to expose the uppermost insulating layer. As a result, cylindrical vertical pillars 130 may be formed in the vertical holes 131, and the inside of each vertical pillar 130 may be filled with a filling insulating layer 137. Alternatively, the semiconductor layer may be formed to fill the vertical holes 131. In this case, the filling insulating layer 137 may not be required. Upper portions of the vertical pillars 130 may be recessed to be lower than the uppermost insulating layer. Conductive patterns 139 may be formed in the vertical holes 131 with the recessed vertical pillars 130. The conductive patterns 139 may be formed of a conductive material such as doped polysilicon or a metal. Drain regions may be formed by introducing impurities of second conductivity type into the conductive patterns 139 and upper portions of the vertical pillars 130. The second conductivity type may be N-type.

Figure 12A:
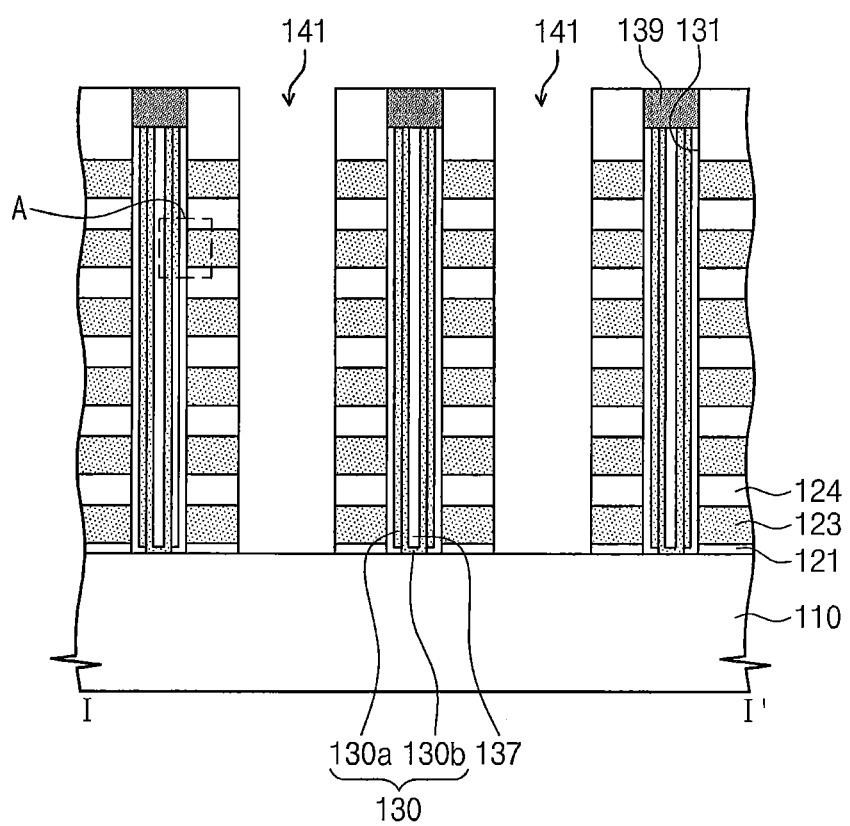
Figure 12B:
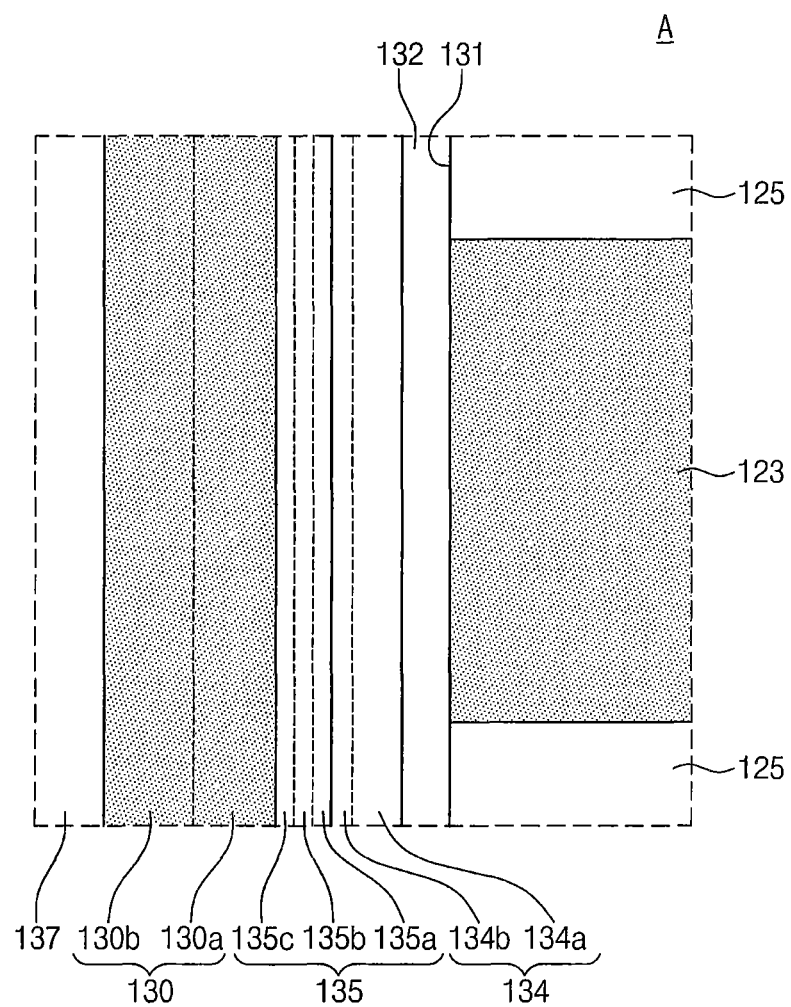

Referring to FIGS. 12A and 12B, the buffer dielectric layer 121, the sacrificial layers 123, and the insulating layers 124 are successively patterned to form separation trenches 141 that are spaced apart from each other, extend in a first direction, and expose a portion of the substrate 110. The patterned insulating layers 124 may serve as the inter-gate insulating patterns 125.

Figure 13A:
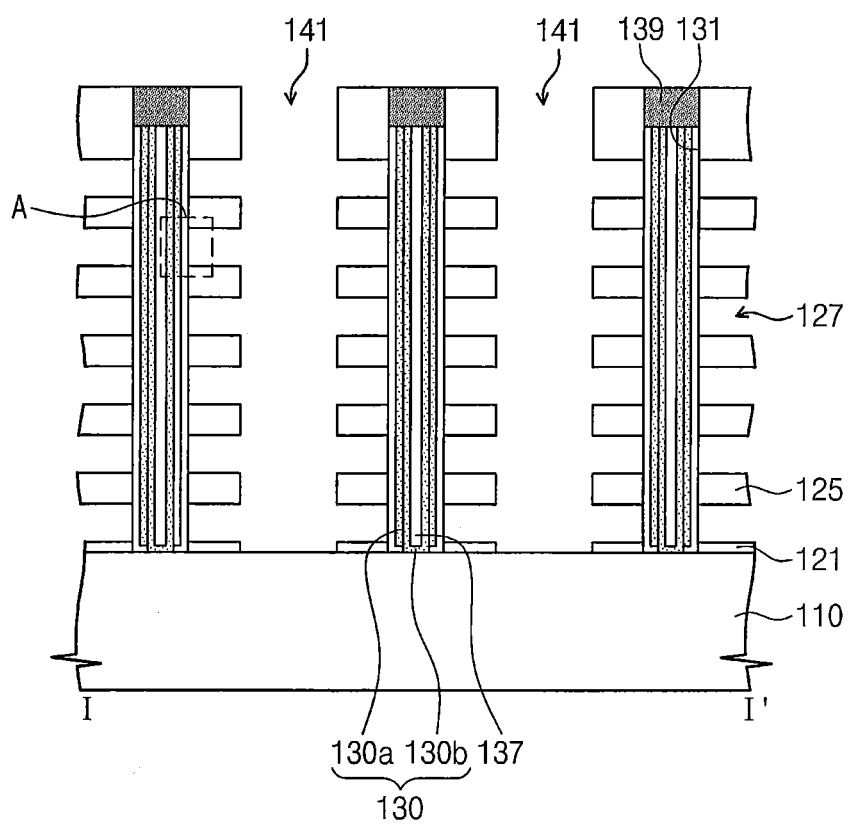
Figure 13B:
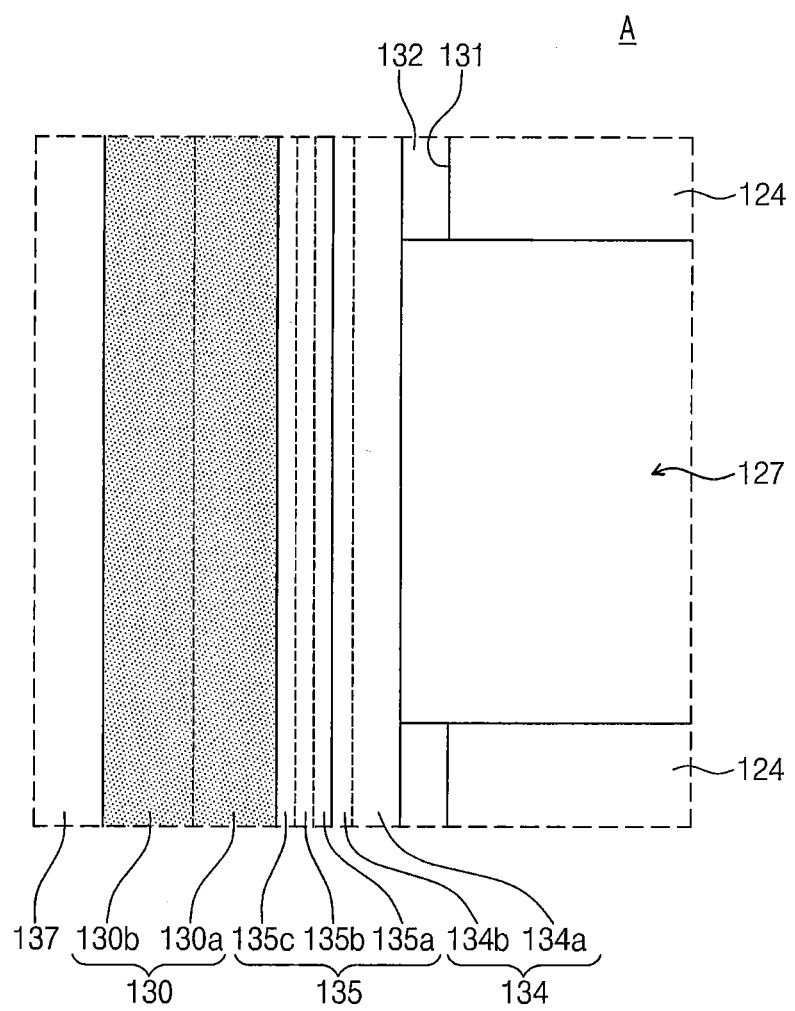

Referring to FIGS. 13A and 1313, the sacrificial layers 123 exposed by the separation trench 141 may be selectively removed to form gate regions 127. The gate regions 127 may be empty spaces, which are formed by removing the sacrificial layers 123 and are delimited by the vertical pillars 130 and the inter-gate insulating patterns 125. In the case where each of the sacrificial layers 123 includes a silicon nitride layer or a silicon oxynitride layer, the removal of the sacrificial layers 123 may be performed using etching solution containing phosphoric acid. The side surface of each of the vertical pillars 130 may be partially exposed by the gate regions 127.

The protection layer 132 may prevent the charge-storing layer 134 from being damaged by an etching solution for removing the sacrificial layers 123. Portions of the protection layer 132 exposed by the gate regions 127 may be selectively removed. In the case where the protection layer 132 is a silicon oxide layer, the protection layer 132 may be removed using, for example, etching solution containing hydrofluoric acid. The gate regions 127 may be formed to expose portions of the charge-storing layer 134.

Figure 14A:
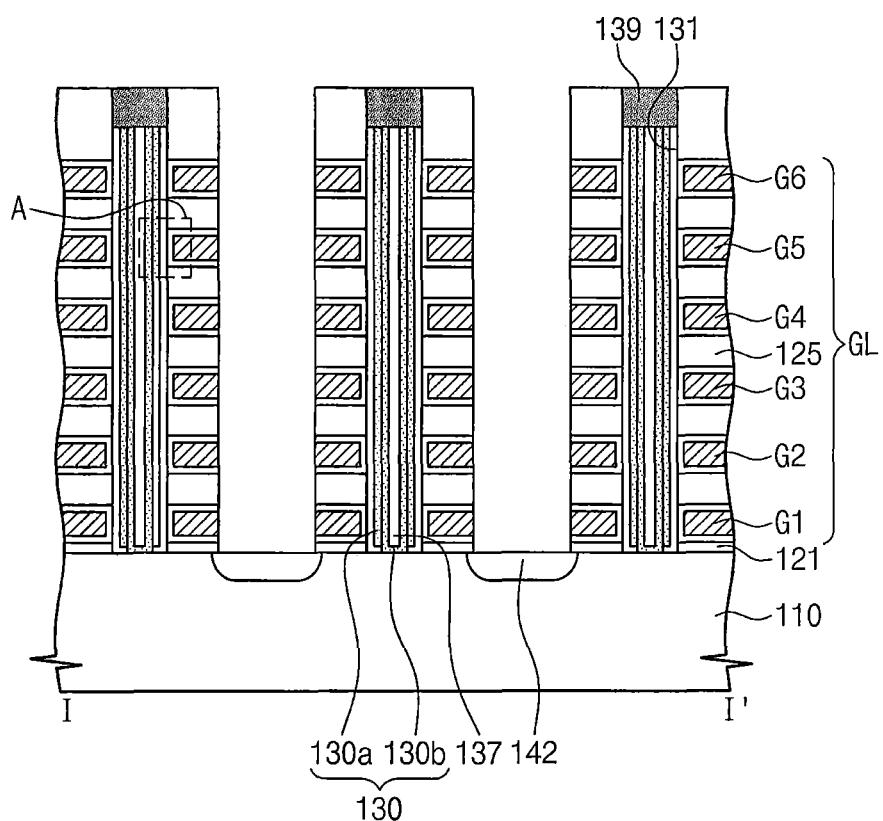
Figure 14B:
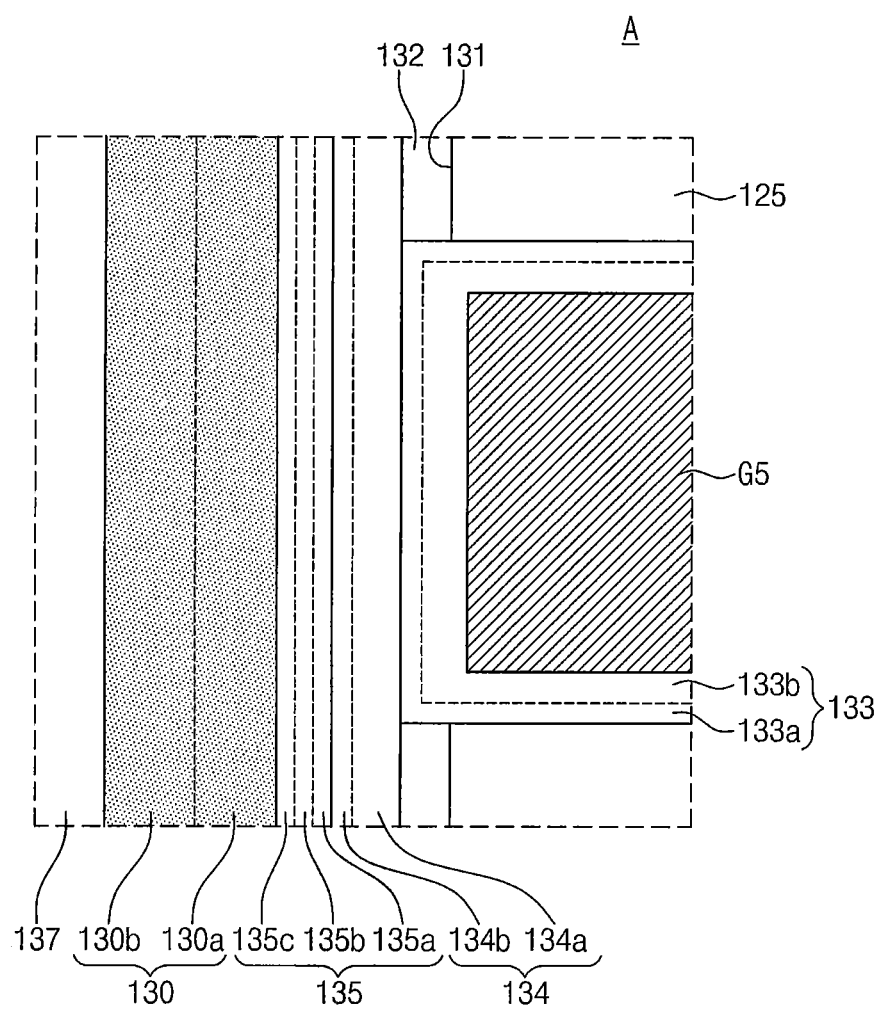

Referring to FIGS. 14A and 14B, the blocking insulating layer 133 may be formed on the inter-gate insulating patterns 125 and the charge-storing layer 134 exposed by the gate regions 127. The blocking insulating layer 133 may include a high-k dielectric material, such as aluminum oxide or hafnium oxide. The blocking insulating layer 133 may have a multi-layered structure including a plurality of thin-films. For example, the blocking insulating layer 133 may include the first blocking insulating layer 133a and the second blocking insulating layer 133b that are sequentially formed in the gate regions 127. For example, the first blocking insulating layer 133a may be a silicon oxide layer, and the second blocking insulating layer 133b may be an aluminum oxide layer and/or a hafnium oxide layer. The blocking insulating layer 133 may be formed by an atomic layer deposition process.

A conductive layer may be formed in the gate region 127. The conductive layer may be formed of at least one of a doped poly-silicon layer, a metal layer (e.g., tungsten), or a metal nitride layer. The conductive layer may be formed by an atomic layer deposition.

The conductive layer may be removed from the outside of the gate region 127 (i.e., the separation trench 141) to form the gate electrodes G1-G6 in the gate regions 127. The semiconductor substrate 110 may be exposed through the separation trenches 141 by removing the conductive layer. Impurity ions of the second conductivity type may be injected into portions of the semiconductor substrate 110 exposed by the separation trenches 141 to form the common source regions 142.

Referring back to FIGS. 8A through 8D, the insulating spacer 143 may be formed on the sidewalls of the separation trenches 141. The formation of the insulating spacer 143 may include depositing a silicon oxide layer or a silicon nitride layer and then anisotropically etching the deposited layer.

The device isolation patterns 145 may be formed to fill the separation trenches 141. The device isolation patterns 145 may be formed to extend parallel to the first direction D1. The device isolation pattern 145 may include a silicon oxide layer. The device isolation pattern 145 may be formed to have a top surface that is coplanar with that of the uppermost one of the inter-gate insulating patterns 125.

The strapping plugs 140 may be formed through the device isolation patterns 145. In certain embodiments, the barrier layer 148 may be formed between the device isolation pattern 145 and the strapping plugs 140. The strapping plugs 140 may include a metal (e.g., of tungsten, copper or aluminum). The barrier layer 148 may include a conductive metal nitride (e.g., of titanium nitride or tantalum nitride). The strapping plugs 140 may be electrically connected to the common source regions 142 via the common contact layers (not shown).

The first contacts 162 may be formed on and connected to the strapping plugs 140. The strapping line 160 may be formed on and connected to the first contacts 162. The strapping line 160 may be formed to be parallel to the first direction D1. Accordingly, the strapping line 160 may be electrically connected to the strapping plugs 140 through the first contacts 162. The strapping line 160 and the first contacts 162 may include at least one selected from the group consisting of metals (e.g., tungsten, copper, or aluminum), conductive metal nitrides (e.g., titanium nitride or tantalum nitride), or transition metals (e.g., titanium or tantalum).

The second contacts 164 may be formed on and connected to the vertical pillars 130. The bit lines BL may be formed on and connected to the second contacts 164. The bit lines BL may extend parallel to the second direction D2. Accordingly, the bit lines BL may be electrically connected to the vertical pillars 130 through the second contacts 164. The bit lines BL and the second contacts 164 may include at least one selected from the group consisting of metals (e.g., tungsten, copper, or aluminum), conductive metal nitrides (e.g., titanium nitride or tantalum nitride), or transition metals (e.g., titanium or tantalum).

The third contacts 166 may be formed on and connected to the strapping line 160. The common source line CSL may be formed on and connected to the third contacts 166. Accordingly, the common source line CSL may be electrically connected to the strapping line 160 through the third contacts 166. The common source line CSL and the third contacts 166 may include at least one selected from the group consisting of metals (e.g., tungsten, copper, or aluminum), conductive metal nitrides (e.g., titanium nitride or tantalum nitride), or transition metals (e.g., titanium or tantalum).

However, the structure of the data storing element S is not limited to the afore-described embodiments. Hereinafter, some examples of the structures of the data storing element S will be described with reference to FIGS. 15A through 15E. FIGS. 15A through 15E are enlarged views exemplarily illustrating some possible structures of the portion "A" of FIG. 8C.

Figure 15A:
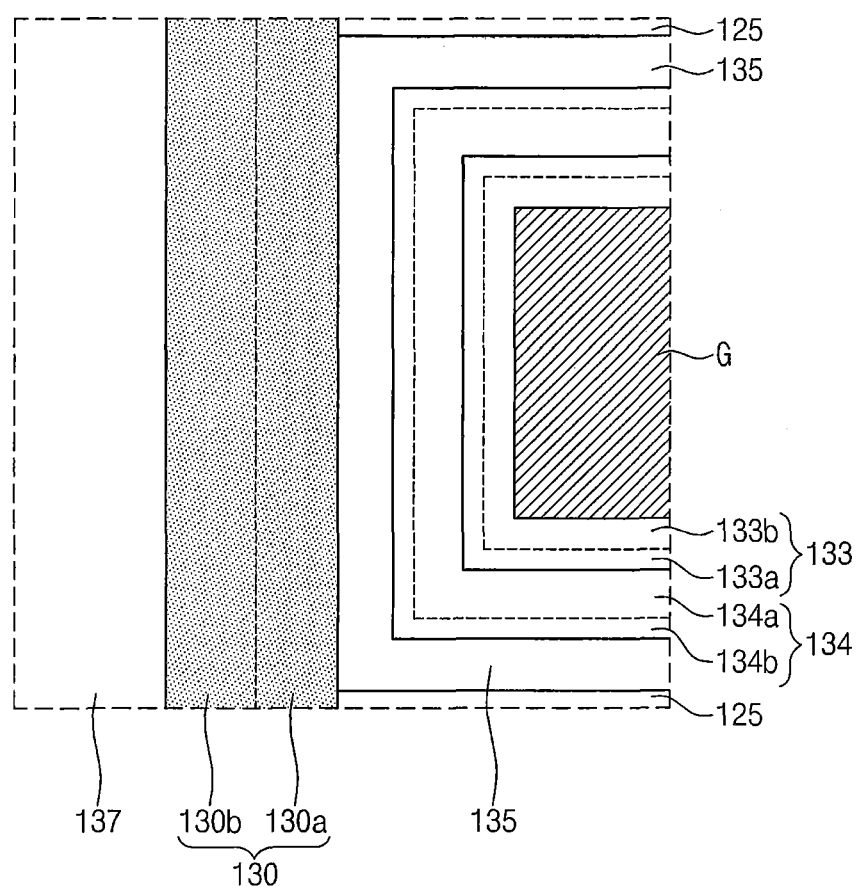
FIGS. 15A through 15E are enlarged views exemplarily illustrating some possible structures of the portion "A" of FIG. 8C.

For example, as shown in FIG. 15A, the data storing element S may include the blocking insulating layer 133 adjacent to the gate electrode G, the tunnel insulating layer 135 adjacent to the vertical active pillars 130, and the charge-storing layer 134 therebetween. The data storing element S may be formed between the gate electrode G and the vertical active pillars 130. The data storing element S may extend between the gate electrode G and the inter-gate insulating patterns 125.

Figure 15B:
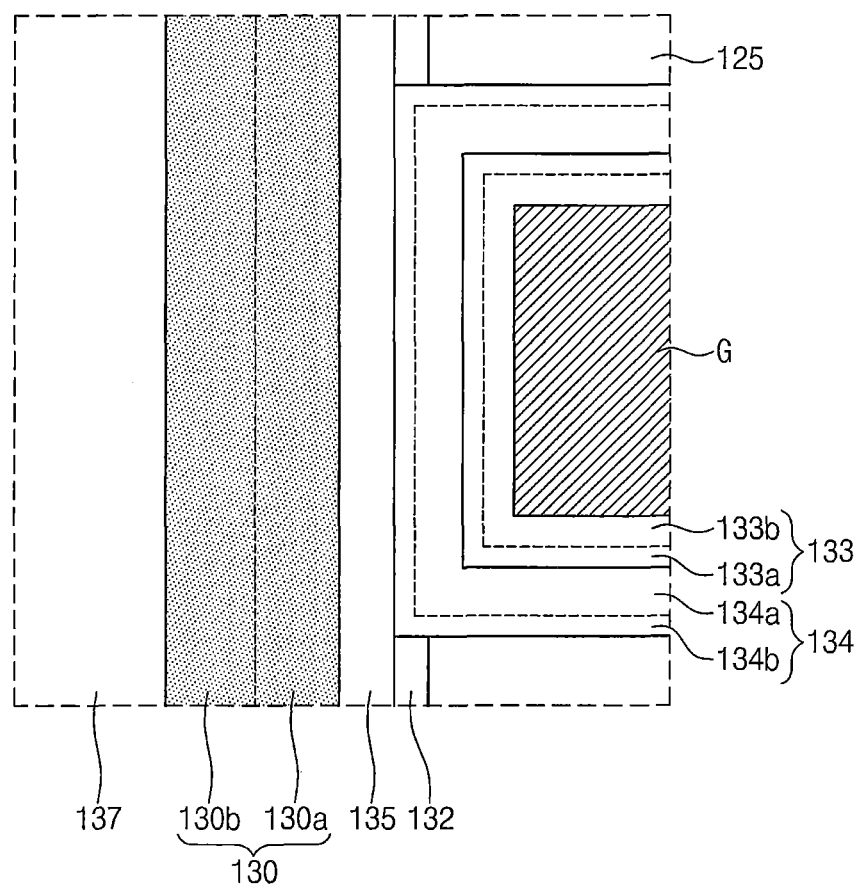
Figure 15C:
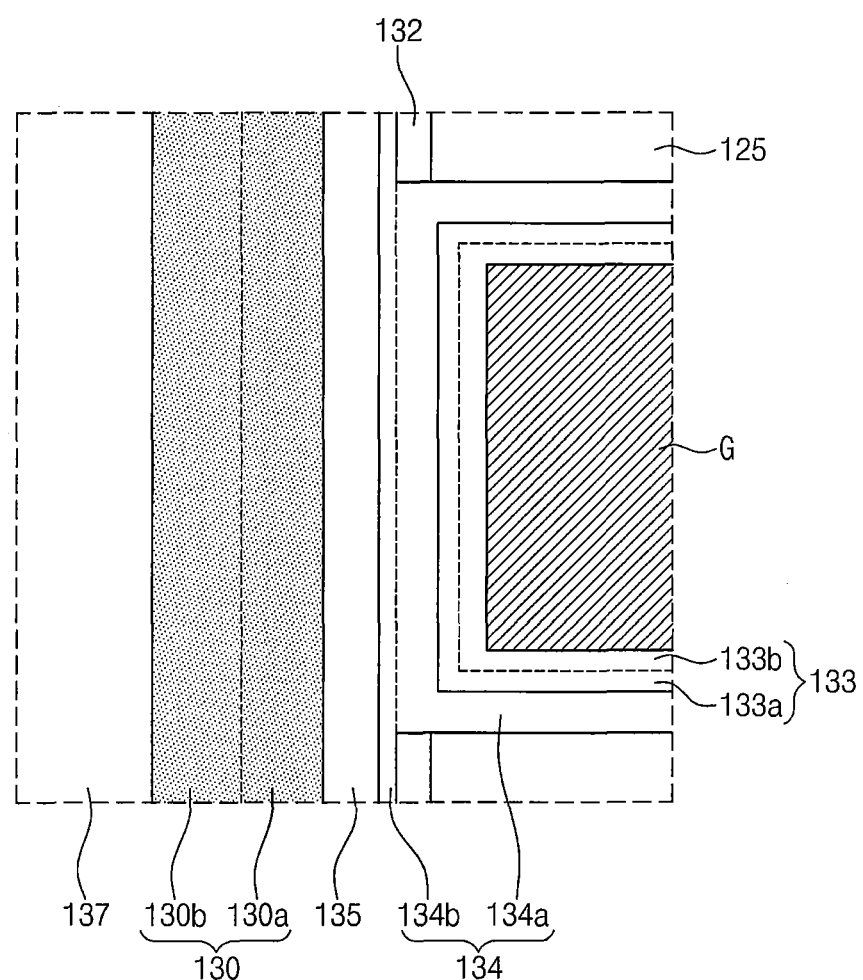
Figure 15D:
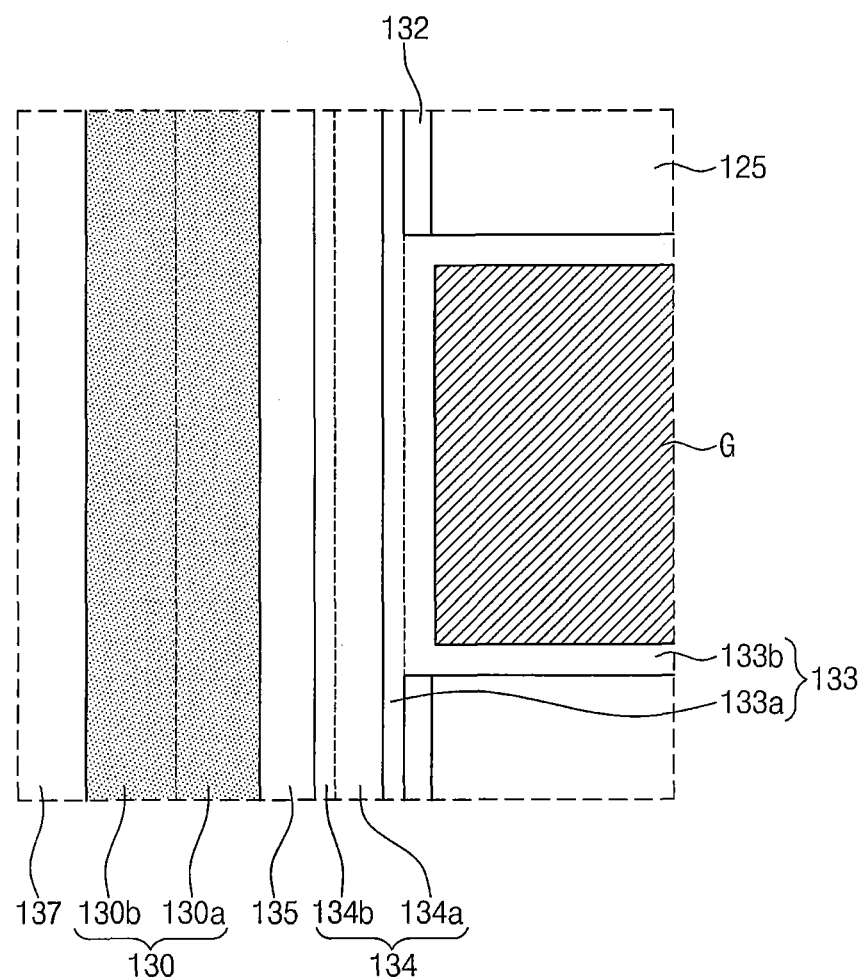
Figure 15E:
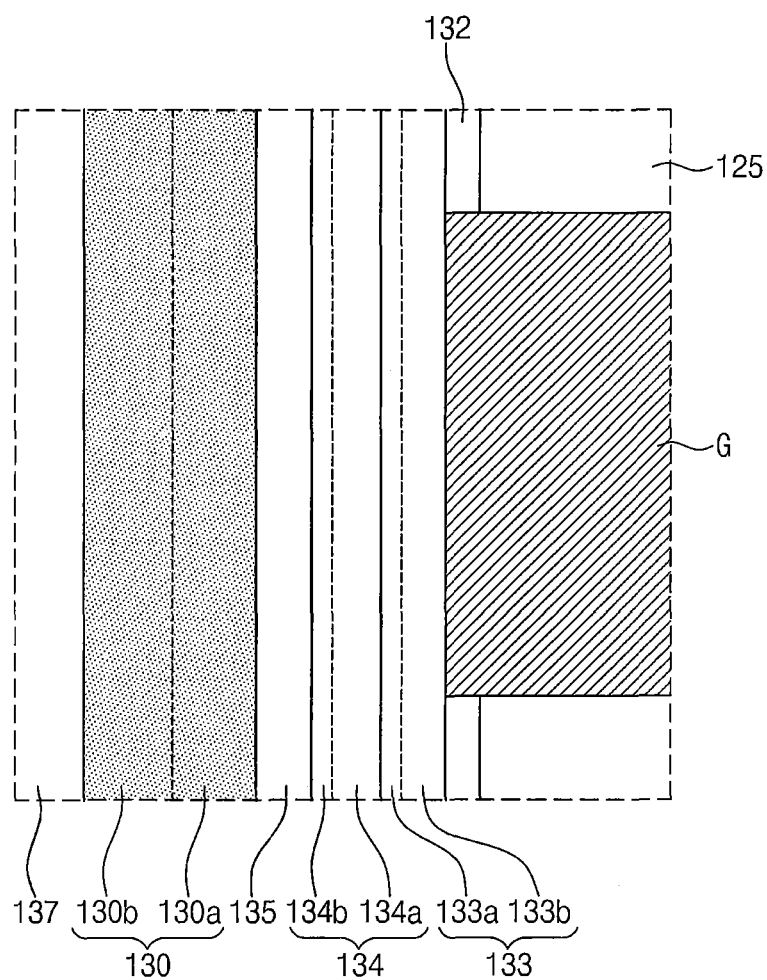

In other embodiments, as shown in FIGS. 15B through 15E, at least a portion of the data storing element S may extend between the inter-gate insulating patterns 125 and the vertical active pillars 130. For example, as shown in FIG. 15B, the tunnel insulating layer 135 may extend between the inter-gate insulating patterns 125 and the vertical active pillars 130, and the charge-storing layer 134 and the blocking insulating layer 133 may extend between the inter-gate insulating patterns 125 and the gate electrode G. As shown in FIG. 15C, the tunnel insulating layer 135 and a portion of the charge-storing layer 134 may extend between the inter-gate insulating patterns 125 and the vertical active pillars 130, and other portion of the charge-storing layer 134 and the blocking insulating layer 133 may extend between the inter-gate insulating patterns 125 and the gate electrode G. As shown in FIG. 15D, the tunnel insulating layer 135 and the charge-storing layer 134 may extend between the inter-gate insulating patterns 125 and the vertical active pillars 130, and a portion of the blocking insulating layer 133 may extend between the inter-gate insulating patterns 125 and the gate electrode G. As shown in FIG. 15E, the tunnel insulating layer 135, the charge-storing layer 134, and the blocking insulating layer 133 may extend between the inter-gate insulating patterns 125 and the vertical active pillars 130.

Figure 16:
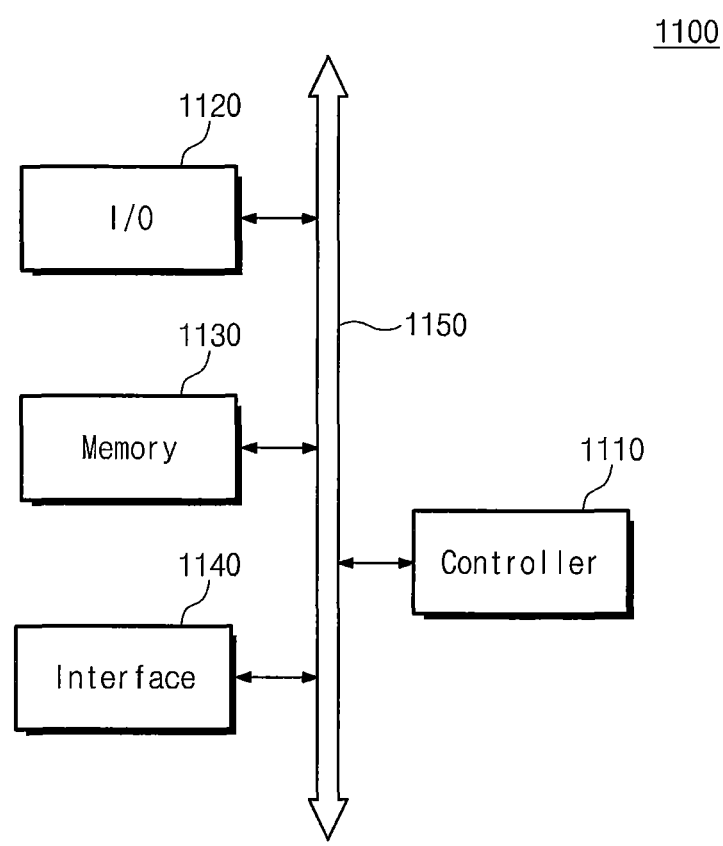
FIG. 16 is a schematic block diagram illustrating an example of electronic systems including a nonvolatile memory device according to example embodiments of the inventive concept.
Figure 17:
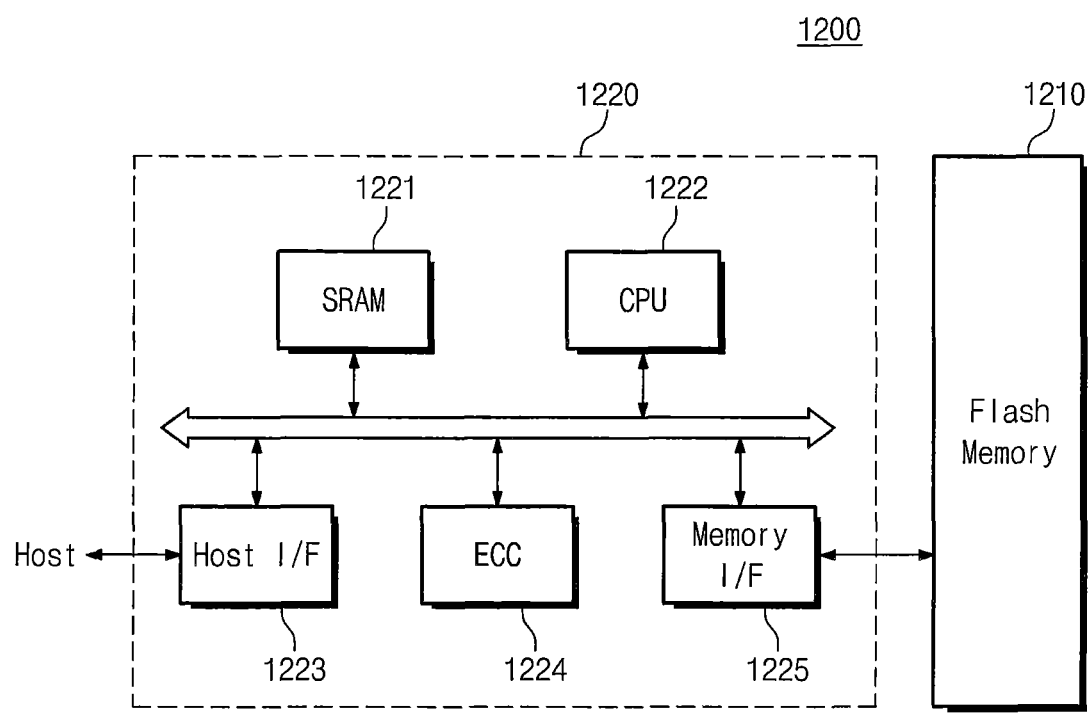
FIG. 17 is a schematic block diagram illustrating an example of memory systems including a nonvolatile memory device according to example embodiments of the inventive concept.

FIG. 16 is a schematic block diagram illustrating an example of electronic systems including a nonvolatile memory device according to example embodiments of the inventive concept, and FIG. 17 is a schematic block diagram illustrating an example of memory systems including a nonvolatile memory device according to the embodiments of the inventive concept.

Referring to FIG. 16, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other via the data bus 1150. The data bus 1150 may correspond to a path through which electrical signals are transmitted. The memory device 1130 may be configured to include one of nonvolatile memory devices according to example embodiments of the inventive concept.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Referring to FIG. 17, a memory system 1200 according to example embodiments of the inventive concept may include a memory device 1210. The memory device 1210 may include at least one of the nonvolatile memory devices according to the afore-described embodiments of the inventive concept. In other embodiments, the memory device 1210 may further include a semiconductor memory device, which is of a different type from the nonvolatile memory devices according to the afore-described embodiments of the inventive concept. For example, the memory device 1210 may further include a nonvolatile memory device and/or a static random access memory (SRAM) device. The memory system 1200 may include a memory controller 1220 that controls data communication between a host and the memory device 1210. The memory device 1210 and/or the memory controller 1220 may be configured to include at least one of the nonvolatile memory devices according to example embodiments of the inventive concept.

The memory controller 1220 may include a processing unit 1222 that controls overall operations of the memory system 1200. In addition, the memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory system 1200 may further include a read only memory (ROM) device that stores code data to interface with the host. The memory system 1200 may be used as a portable data storage card. Alternatively, the memory system 1200 may be provided in the form of solid state disks (SSD), instead of hard disks of computer systems.

Figure 18:
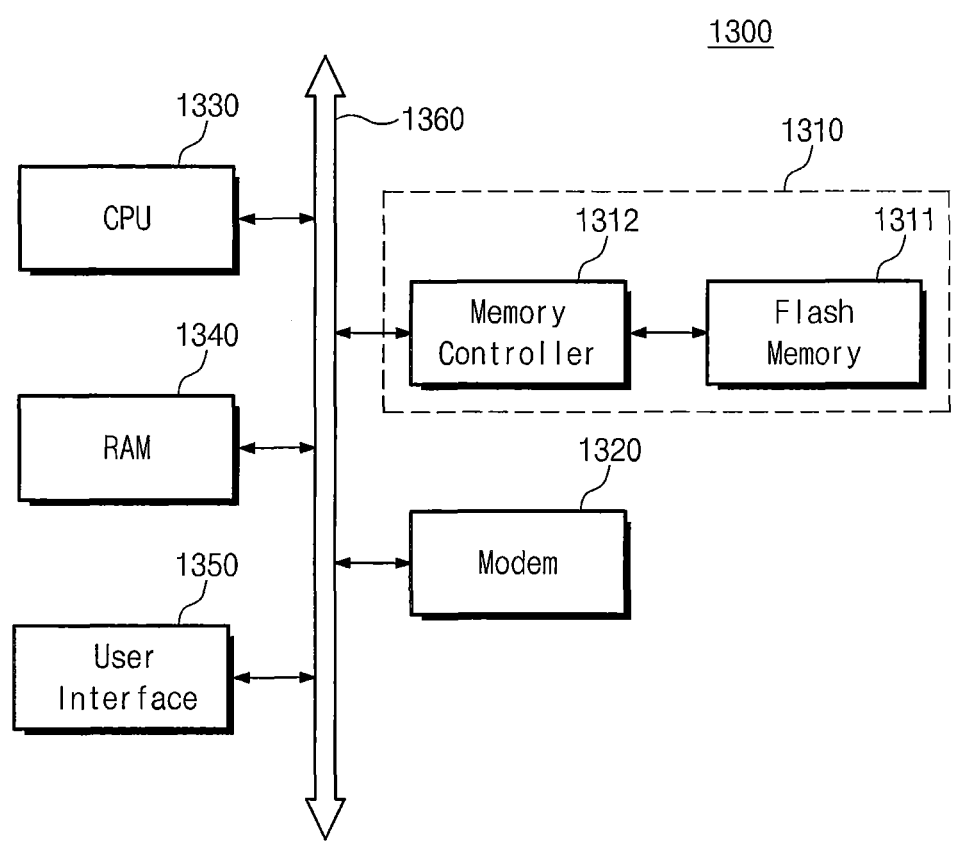
FIG. 18 is a schematic block diagram illustrating an example of information processing systems including a nonvolatile memory device according to example embodiments of the inventive concept.

FIG. 18 is a schematic block diagram illustrating an example of information processing systems including a nonvolatile memory device according to example embodiments of the inventive concept.

Referring to FIG. 18, an information processing system 1300 includes a memory system 1310, which may include at least one of the semiconductor devices according to example embodiments of the inventive concept. In certain embodiments, the information processing system 1300 may be used to realize a mobile device or a desktop computer. The information processing system 1300 also includes a modem 1320, a central processing unit (CPU) 1330, a RAM 1340, and a user interface 1350, which may be electrically connected to the memory system 1310 via a system bus 1360. The memory system 1310 may have the same configuration as that of the memory system 1200 described above. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may be provided as a solid state drive SSD, and thus, the information processing system 1300 may be able to store reliably a large amount of data in the memory system 1310. This increase in reliability enables the memory system 1310 to conserve resources for error correction and realize a high speed data exchange function. Although not shown in the drawing, it will be apparent to those of ordinary skill in the art that the information processing system 1300 may be also configured to include an application chipset, a camera image processor (CIS), and/or an input/output device.

According to example embodiments of the inventive concept, a nonvolatile memory device may include a charge-storing layer, whose total trap density is controlled to be higher than a specific value. Accordingly, the nonvolatile memory device can have improved reliability. Especially, it is possible to prevent an IVS property of the MLC or TLC nonvolatile memory device from being deteriorated.

While example embodiments of the inventive concepts have been particularly shown and described, it will be understood by one of ordinary skill in the art that variations in form and detail may be made therein without departing from the spirit and scope of the attached claims.

What is claimed is:

1. A nonvolatile memory device, comprising:
    a vertically-stacked gate structure including a plurality of inter-gate insulating patterns stacked on a substrate and a plurality of gate electrodes interposed between the inter-gate insulating patterns in an alternating gate electrode and insulating pattern sequence;
    a vertical active pillar extending at least partially through the vertically-stacked gate structure;
    a vertical charge-storing layer extending between the vertical active pillar and the plurality of gate electrodes;
    a vertical tunnel insulating layer extending between the vertical charge-storing layer and the vertical active pillar; and
    a vertical blocking insulating layer extending between the vertical charge-storing layer and the plurality of gate electrodes;
    wherein the vertical charge-storing layer comprises a first charge-storing layer containing silicon nitride adjacent to the vertical blocking insulating layer and a second charge-storing layer adjacent to the vertical tunnel insulating layer, said second charge-storing layer comprising silicon oxynitride;
    wherein the vertical tunnel insulating layer comprises a first tunnel insulating layer adjacent to the second charge-storing layer and a second tunnel insulating layer adjacent to the vertical active pillar; and
    wherein the first tunnel insulating layer comprises a silicon oxide layer having a nitrogen concentration therein that is lower than a nitrogen concentration within the second charge-storing layer.

2. The nonvolatile memory device of claim 1, wherein the second charge-storing layer has a thickness less than 20 Å.

3. The nonvolatile memory device of claim 1, wherein the second tunnel insulating layer comprises silicon oxide; and wherein a nitrogen concentration within the second tunnel insulating layer is greater than the nitrogen concentration within the first tunnel insulating layer and less than the nitrogen concentration within the second charge-storing layer.

4. The nonvolatile memory device of claim 1, wherein each of the first and second tunnel insulating layers contains about 5 atomic percent to about 20 atomic percent nitrogen; and wherein the second charge-storing layer contains at least about 30 atomic percent nitrogen.

5. The nonvolatile memory device of claim 1, wherein the vertical blocking insulating layer comprises a first vertical blocking insulating layer adjacent to the vertical charge-storing layer and a second vertical blocking insulating layer adjacent to the plurality of gate electrodes.

6. The nonvolatile memory device of claim 5, wherein the first vertical blocking insulating layer and the second vertical blocking insulating layer comprise silicon oxide and aluminum oxide, respectively.

7. The nonvolatile memory device of claim 5, wherein at least a portion of the vertical blocking insulating layer extends between the plurality of gate electrodes and the plurality of inter-gate insulating patterns.

8. The nonvolatile memory device of claim 7, wherein at least a portion vertical charge-storing layer extends between the plurality of gate electrodes and the plurality of inter-gate insulating patterns.

9. A nonvolatile charge trap memory cell, comprising:
    a tunnel insulating layer on a semiconductor active region;
    a charge-storing layer on the tunnel insulating layer;
    a blocking insulating layer on the charge-storing layer; and
    a gate electrode on the blocking insulating layer;
    wherein said charge storing layer comprises a first charge-storing layer contacting the blocking insulating layer and a second charge-storing layer contacting the tunnel insulating layer, said first charge-storing layer comprising silicon nitride and said second charge-storing layer comprising silicon oxynitride and having a thickness in a range from about 5 Å to about 20 Å, wherein the thickness of the second charge-storing layer is less than about 20 Å.

10. The memory cell of claim 9, wherein the charge-storing layer extends between the tunnel insulating layer and the blocking insulating layer;
    wherein the blocking insulating layer extends between the charge-storing layer and the gate electrode;
    wherein the tunnel insulating layer extends between the charge-storing layer and the semiconductor active region and contains about 5 atomic percent to about 20 atomic percent nitrogen; and wherein the second charge-storing layer contains at least about 30 atomic percent nitrogen.

11. A nonvolatile memory device, comprising:
a gate electrode;
an active layer;
a charge-storing layer between the active layer and the gate electrode;
a tunnel insulating layer between the charge-storing layer and the active layer; and
a blocking insulating layer between the charge-storing layer and the gate electrode,
wherein the charge-storing layer comprises a first charge-storing layer adjacent to the blocking insulating layer and a second charge-storing layer adjacent to the tunnel insulating layer;
wherein the first charge-storing layer comprises a silicon nitride layer, and wherein the second charge-storing layer comprises a silicon oxynitride layer; and
wherein the blocking insulating layer comprises a first blocking insulating layer adjacent to the charge-storing layer and a second blocking insulating layer adjacent to the gate electrode.

12. The nonvolatile memory device of claim 11, wherein the tunnel insulating layer comprises a first tunnel insulating layer adjacent to the second charge-storing layer and a second tunnel insulating layer adjacent to the active layer, and
wherein the first tunnel insulating layer comprises a silicon oxide layer having a nitrogen concentration that is lower than a nitrogen concentration of the second charge-storing layer.

13. The nonvolatile memory device of claim 12, wherein the second tunnel insulating layer comprises a silicon oxide layer having a nitrogen concentration that is between the nitrogen concentrations of the first tunnel insulating layer and the second charge-storing layer.

14. The nonvolatile memory device of claim 11, wherein the tunnel insulating layer contains about 5 at. % to about 20 at. % nitrogen, and the second charge-storing layer contains at least about 30 at. % nitrogen.

15. The nonvolatile memory device of claim 11, wherein the
second charge-storing layer has a thickness less than 20 Å.

16. The nonvolatile memory device of claim 11, wherein the first blocking insulating layer comprises a silicon oxide layer, and the second blocking insulating layer comprises an aluminum oxide layer.

17. The nonvolatile memory device of claim 11,
wherein the gate electrode comprises one gate electrode among a plurality of gate electrodes,
wherein the nonvolatile memory device further comprises a vertically-stacked gate structure including a plurality of inter-gate insulating patterns stacked on a substrate and the plurality of gate electrodes interposed between the inter-gate insulating patterns in an alternating gate electrode and insulating pattern sequence,
wherein at least a portion of the blocking insulating layer extends between the plurality of gate electrodes and the inter-gate insulating patterns.

18. The nonvolatile memory device of claim 11,
wherein the gate electrode comprises one gate electrode among a plurality of gate electrodes,
wherein the nonvolatile memory device further comprises a vertically-stacked gate structure including a plurality of inter-gate insulating patterns stacked on a substrate and the plurality of gate electrodes interposed between the inter-gate insulating patterns in an alternating gate electrode and insulating pattern sequence,
wherein at least a portion of the blocking insulating layer extends between the active layer and the inter-gate insulating patterns.

19. The nonvolatile memory device of claim 11,
wherein the gate electrode comprises one gate electrode among a plurality of gate electrodes,
wherein the nonvolatile memory device further comprises a vertically-stacked gate structure including a plurality of inter-gate insulating patterns stacked on a substrate and the plurality of gate electrodes interposed between the inter-gate insulating patterns in an alternating gate electrode and insulating pattern sequence,
wherein at least a portion of the charge-storing layer extends between the plurality of gate electrodes and the inter-gate insulating patterns.

20. The nonvolatile memory device of claim 11,
wherein the gate electrode comprises one gate electrode among a plurality of gate electrodes,
wherein the nonvolatile memory device further comprises a vertically-stacked gate structure including a plurality of inter-gate insulating patterns stacked on a substrate and the plurality of gate electrodes interposed between the inter-gate insulating patterns in an alternating gate electrode and insulating pattern sequence,
wherein at least a portion of the charge-storing layer extends between the active layer and the inter-gate insulating patterns.

* * * * *